(12) United States Patent
Suda et al.

(10) Patent No.: US 6,938,546 B2
(45) Date of Patent: Sep. 6, 2005

(54) PRINTING PRESS, LAYERED FORMATION AND MAKING METHOD THEREOF, AND PRINTING PLATE AND MAKING METHOD THEREOF

(75) Inventors: Yasuharu Suda, Hiroshima-ken (JP); Kozo Iida, Hiroshima-ken (JP); Toyoshi Ohto, Hiroshima-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 10/421,942

(22) Filed: Apr. 24, 2003

(65) Prior Publication Data

US 2004/0003737 A1 Jan. 8, 2004

(30) Foreign Application Priority Data

Apr. 26, 2002 (JP) .................................. 2002-126722
Aug. 2, 2002 (JP) .................................. 2002-226541

(51) Int. Cl.⁷ ............................ B41C 1/10; B41N 1/14; G03F 7/11
(52) U.S. Cl. ................... 101/467; 101/453; 101/478; 430/271.1; 430/302
(58) Field of Search ................... 101/453, 455, 101/456, 463.1, 465–467, 478; 430/49, 270.1, 271.1, 272.1, 302

(56) References Cited

U.S. PATENT DOCUMENTS

| 6,079,331 A | * | 6/2000 | Koguchi et al. ............ 101/467 |
| 6,318,264 B1 | | 11/2001 | D'Heureuse et al. ....... 101/467 |
| 2002/0000169 A1 | * | 1/2002 | Suda et al. ............... 101/463.1 |
| 2002/0062755 A1 | * | 5/2002 | Suda et al. ................. 101/488 |

FOREIGN PATENT DOCUMENTS

| EP | 0 869 156 A1 | 10/1998 |
| EP | 0 932 081 A1 | 7/1999 |
| EP | 1 084 863 A1 | 3/2001 |
| EP | 1 160 082 A2 | 12/2001 |
| EP | 1 211 064 A2 | 6/2002 |
| EP | 1 253 008 A2 | 10/2002 |
| JP | 63-102936 | 5/1988 |
| JP | 9-230118 | 9/1997 |
| JP | 10-85610 | 4/1998 |
| JP | 10-114545 | 5/1998 |
| JP | 10-250027 | 9/1998 |
| JP | 2917525 | 4/1999 |
| JP | 11-105234 | 4/1999 |
| JP | 11-147360 | 6/1999 |
| JP | 11-197512 | 7/1999 |
| JP | 11-254633 | 9/1999 |
| JP | 2000-6360 | 1/2000 |

(Continued)

OTHER PUBLICATIONS

Y. Suda, et al., "A New Technology of Reusable Palate Using TiO₂ Photocatalysis," TAGA'S 53ʳᵈ Annual Technical Conference; San Diego, CA, United States May 6–9, 2001, pp. 125–124.

(Continued)

Primary Examiner—Stephen R. Funk
(74) Attorney, Agent, or Firm—Armstrong, Kratz, Quintos, Hanson & Brooks, LLP

(57) ABSTRACT

A layered formation, possibly used as a printing plate that is to be mounted to a printing press when performing printing, has a photocatalystic layer including a photocatalyst so that the surface of the photocatalyst layer is rapidly hydrophilized by irradiating with light having a lower irradiating energy. The layered formation or a printing plate includes an intermediate layer having two or more kinds of oxide semiconductors or a solid acid between a substrate and the photocatalyst layer.

26 Claims, 9 Drawing Sheets

1: SUBSTRATE
2: INTERMEDIATE LAYER
3: PHOTOCATALYST LAYER
5: PRINTING PLATE
6: WATER

FOREIGN PATENT DOCUMENTS

| | | |
|---|---|---|
| JP | 2000-62334 | 2/2000 |
| JP | 2000-62335 | 2/2000 |
| JP | 2000-225779 | 8/2000 |
| JP | 2001-205104 | 7/2001 |
| JP | 2001-207082 | 7/2001 |
| WO | WO97/23572 A1 | 7/1997 |
| WO | WO 00/58095 | 10/2000 |
| WO | WO 03/068523 A1 | 8/2003 |
| WO | WO 03/068524 A1 | 8/2003 |
| WO | WO 03/072368 A1 | 9/2003 |

OTHER PUBLICATIONS

T. Minabe et al.; Study of Photo–Induced hydrophilic Conversion on the $TiO_2$ Surfaces Involved by Structural Conformation Thereof'; Material for the Fifth Symposium on "Recent Developments of Photocatalytic Reactions" of the Photo Functionalized Materials Society; 1998/Translation attached.

* cited by examiner

1: SUBSTRATE
2: INTERMEDIATE LAYER
3: PHOTOCATALYST LAYER
5: PRINTING PLATE
6: WATER

1: SUBSTRATE
2: INTERMEDIATE LAYER
3: PHOTOCATALYST LAYER
5: PRINTING PLATE
6: WATER

1: SUBSTRATE
2: INTERMEDIATE LAYER
3a: PHOTOCATALYST LAYER (NON-IMAGE AREA)
3b: PHOTOCATALYST LATER (IMAGE AREA)
5: PRINTING PLATE

10: PRINTING PRESS
11: PLATE CYLINDER
12: PLATE CLEANING UNIT
13: IMAGING UNIT
14: SURFACE HYDROPHOBIZING UNIT
15: HEATING DEVICE
16: LIGHT EMITTING DEVICE FOR HYDROPHILIZING
    (FORMED IMAGE DELETING UNIT)
17: INKING ROLLERS
18: FOUNTAIN SOLUTION FEEDER
19: BLANKET CYLINDER
20: PAPER

PRINTING PRESS, LAYERED FORMATION AND MAKING METHOD THEREOF, AND PRINTING PLATE AND MAKING METHOD THEREOF

BACKGROUND OF THE INVENTION

1. Field of the Invention

The present invention relates to a layered formation including a photocatalyst and a making method thereof, a printing plate able to be reused and a making method thereof, and a printing press.

2. Description of the Related Art

In recent years, digitalization of printing process has become progressing in the art. This technology involves creation of images and manuscripts in digitized form on a personal computer or reading images on a scanner and directly makes a printing plate based on the digital data thus obtained. This makes it possible to save labor in the printing processes and also to conduct high-precision printing with ease.

As printing plates, so-called PS plates (presensitized plates) have been commonly used to date. A PS plate includes a hydrophilic non-image area made of anodized aluminum and has one or more hydrophobic image areas formed by hardening a photosensitive resin on the surface of the anodized aluminum. Making of a printing plate with such a PS plate requires plural steps and hence, is time-consuming and costly. It is, therefore, difficult to reduce the time and the cost required for printing. Especially in short run printing, the requirement for the plural steps is a cause of increased costs. Further, use of a PS plate requires a development step using an alkaline developer, which has raised serious problems both with the amount of labor required and also with environmental pollution caused by treatment of developer waste.

Further, it is a common practice to expose a PS plate on whose surface which functions as a printing plate, a film with an original picture image formed thereon with perforated holes is closely attached. The above manner becomes problematic in making the printing plate directly from digital data and in promoting a digitized printing process. Moreover, after a print job, it is necessary to replace the printing plate with another one in order to conduct printing of a next print job so that used printing plates have been thrown away.

To solve the above-described problems of PS plates, processes have been proposed to meet the digitization of printing processes while making it possible to omit the development step, and some of such processes have come into commercial use. For example, Japanese Patent Application Laid-Open (KOKAI) Publication No. SHO 63-102936 discloses a process of making a plate which comprises the steps of: applying a jet-form ink containing a photosensitive resin, as an ink for a liquid ink-jet printer, onto the surface of a printing plate; and hardening an image area by irradiation with light. Japanese Patent Application Laid-Open (KOKAI) Publication No. HEI 11-254633, on the other hand, discloses a process for making a color offset printing plate by an ink-jet head through which a solid ink is jetted.

Also included in known processes are a process for making a printing plate, which comprises the step of writing with a laser beam an image on a printing plate, which is made of a PET (polyethylene terephthalate) film on which a laser absorbing layer such as carbon black covered with a silicone resin layer is formed, to cause the laser absorbing layer to evolve heat, which ablates off the silicone resin layer by the heat; and another process for making a printing plate, which comprises the step of coating an aluminum plate with a lipophilic laser absorbing layer, coating a hydrophilic layer on the laser absorbing layer, and then ablating off the hydrophilic layer with a laser beam as in the above-described process.

In addition, a process has also been proposed for the making of a printing plate made of a hydrophilic polymer by exposing the hydrophilic polymer imagewise such that the hydrophilic polymer becomes lipophilic.

Further, a process of directly forming an image on a PS plate with light from a digital data is also proposed. For this purpose, an imaging unit utilizes blue laser having a wavelength of 402 nm, and a so-called CTP (Computer To Plate) device including a micromirror and a UV (ultraviolet) lamp have been put onto the market.

But, since each of the above-mentioned processes cannot continue to perform an ensuing print job (printing an ensuing print pattern) until a printing plate is replaced by another one subsequent to completion of a print job, they are not different from the conventional art in that the printing plate is thrown away after its one-time use even if it is possible to make printing plates directly from digital data.

On the other hand, a technique including regeneration of a printing plate is disclosed. For example, Japanese Patent Application Laid-Open (KOKAI) Publication No. HEI 10-250027 refers to a latent image block copy making use of a titanium dioxide photocatalyst, a making process of the latent image block, and a printing press having the latent image block. Japanese Patent Application Laid-Open (KOKAI) Publication No. HEI 11-147360 also discloses an offset printing process by a printing plate making use of a photocatalyst. Each of these disclosures forms an image using light (practically, ultraviolet light) to activate the photocatalyst and regenerates a printing plate by hydrophobization of the photocatalyst caused by heat treatment. Further, Japanese Patent Application Laid-Open (KOKAI) Publication No. HEI 11-105234 discloses a making process for a lithographic printing plate, which comprises the step of hydrophilizing a photocatalyst with activating light, i.e., ultraviolet rays, and then forming an image area by a heat-mode recording.

As disclosed in the paper (pages 124–125) entitled "Study on Behavior of Photoinduced Hydrophilization Associated with Structural Change in Titanium dioxide Surface (by Minabe, et al.) distributed at the Fifth Symposium on "Recent Developments of Photocatalytic Reactions" of the Photo Functionalized Materials Society in 1998, Prof Fujishima, Prof Hashimoto, et al. of the Research Center for Advanced Science and Technology, The University of Tokyo, have confirmed hydrophilization of a titanium dioxide photocatalyst by heat treatment. According to the description in the above paper, the processes, or heat treatment, disclosed in the laid-open patent applications referred to in the above, cannot hydrophobize photocatalyst thereby regenerate a printing plate, so that neither recycling nor newly preparing a printing plate is available.

With the foregoing problems in view, the Inventors have been enthusiastically researching to develop a printing plate on which an image is rapidly formed using activating light having energy higher than a band-gap energy of the photocatalyst included in the printing plate, which light is emitted from an imaging unit, and which can be regenerated for future reuse after the formed image is printed, and methods for making and regenerating such a printing plate.

As a result of the research, it was found that the surface of a printing plate needs to be hydrophilized when an image is formed on the printing plate or the image is deleted from the printing plate for regeneration. It is an important object of such processes to execute hydrophilization in a shorter time with a weaker light.

As to photo-induced hydrophilization (hereinafter simply called hydrophilization), the paper (pages 44–45) entitled "Effects of $TiO_2/WO_3$ Thin Films on Hydrophilization properties" (by Irie, et al.) distributed at the Eighth Symposium on "Recent Developments of Photocatalytic Reactions" of the Photo Functionalized Materials Society in 2001 discloses a technique of sensitization of photocatalytic activity, especially photo-induced hydrophilization, by forming a thin film of $TiO_2$ (titanium dioxide) on a thin film made of $WO_3$ (tungsten trioxide).

The recent research estimates that positive holes relate to hydrophilization of titanium dioxide. Namely, those skilled in the art estimate that the sensitivity of hydrophilization is improved by making $TiO_2$ and $WO_3$ into a complex form so that movement of electrons generated in $TiO_2$ by irradiation with activating light to $WO_3$ improves charge separation (preventing an electron and a positive hole from re-combining) efficiency and by providing $TiO_2$ with positive holes generated in $WO_3$.

Application of such a technique to a printing plate sensitizes hydrophilization of a photocatalyst layer (in other words, reduces energy required for the hydrophilization) so that an image is formed on the printing plate with weaker light. It is therefore possible to shorten time to form an image on the printing plate and time to regenerate the printing plate. The formation and the regeneration should be however performed faster in order to speed up printing of an image.

Japanese Patent No. 2917525 discloses a method for hydrophilizing the surface of the substrate coated with a layer including a photocatalyst. More specifically, the surface of the layer including a photocatalyst supports a metal oxide complex serving as a solid acid and the surface is photocatalytically hydrophilized. The metal oxide complex is an oxide hyperacid, which photocatalytically hydrophilizes the surface of the substrate by increasing hydrogen-binding components ($\gamma_s^h$) on the surface energy of solid/gas surface of the layer including the photocatalyst.

Public re-disclosed Patent No. WO97/23572 refers to a method for hydrophilzing the surface of the substrate coated with a layer including a photocatlayst. Supporting an oxide hyperacid on the surface of the layer including a photocatlayst increases hydrogen-binding components ($\gamma_s^h$) on the surface energy of solid/gas surface of the layer including the photocatalyst so that the surface is hydrophilized by physically adhering water molecules to the surface of the layer.

But the disclosure of above-mentioned U.S. Pat. No. 2,917,525 does not mention influence on one of the important and generic properties of a photocatalyst, that is photocatalytic activity to decompose an organic compound, which influence is caused by supporting a metal oxide complex serving as an oxide hyperacid on the surface of the layer including a photocatlayst.

Since the technique described in the above re-publication WO97/23572 refers to preservation of high hydrophilicity by supporting an oxide hyperacid on the surface of the layer including a photocatlayst to allow water molecules to physically adhere to the surface of the layer, it is clear that the technique does not aim at improving a photocatalyst's property of decomposing an organic compound.

The Inventors have been enthusiastically researching to find factors required to improve a photocatalyst's properties of decomposing an organic compound and at the same time hydrophilzing the photocatalyst itself.

SUMMARY OF THE INVENTION

With the foregoing problems in view, it is a first object of the present invention to provide a layered formation and a making method thereof, a printing plate and a making method thereof, which formation and plate comprise photocatalyst layers including a photocatalyst so that the surface of the photocatalyst layers can be rapidly hydrophilized by irradiating with light having a lower irradiating energy. Further it is a second object to provide a printing press on which the printing plate having a photocatalyst layer including a photocatalyst is mounted so that the surface of the photocatalyst layer can be rapidly hydropholized by irradiating with light having a lower irradiating energy.

To attain the first object, as a first generic feature, there is provided a layered formation having properties of decomposing an organic compound on the surface of the layered formation and concurrently hydrophilizing the surface of the layered formation in response to irradiation of the surface of the layered formation with activating light having energy higher than a band-gap energy of a photocatalyst, the layered formation comprising: a substrate; a photocatalyst layer including the photocatalyst; and an intermediate layer including two or more kinds of oxide semiconductors and being formed between the substrate and the photocatalyst layer, so that charge separation efficiency of the photocatalyst layer is improved.

It is thereby possible to enhance catalytic activity of the photocatalyst in the photocatalyst layer whereupon irradiation with light having a lower irradiation energy rapidly hydrophilizes the surface of the photocatalyst layer.

As a second generic feature, there is provided a layered formation having properties of decomposing an organic compound on the surface of the layered formation and concurrently hydrophilizing the surface of the layered formation in response to irradiation of the surface of the layered formation with activating light having energy higher than a band-gap energy of a photocatalyst, the layered formation comprising: a substrate; a photocatalyst layer including the photocatalyst; and an intermediate layer including a solid acid and being formed between the substrate and the photocatalyst layer.

With these layers, the layered formation has greatly improved properties of decomposing the organic compound and hydrophilizing the surface layer including the photocatalyst. The surface and inside of the solid acid is Lewis acid site that can receive electron pairs or Brønsted acid site that provides $H^+$ protons. In the present invention, the solid acid may have Lewis acid site or Brønsted acid site and especially a solid acid with Brønsted acid site is more preferable for the present invention It is thereby possible to enhance catalytic activity of the photocatalyst whereupon irradiation with light having a lower irradiation energy rapidly hydrophilizes the surface of the photocatalyst layer.

As a preferable feature, the solid acid included in the intermediate layer may be a metal oxide complex.

As a further preferable feature, the metal oxide complex may be a selected one from a compound ($SiO_2/TiO_2$) of $SiO_2$ and $TiO_2$, a compound ($SiO_2/ZrO_2$) of $SiO_2$ and $ZrO_2$, a compound ($TiO_2/ZrO_2$) of $TiO_2$ and $ZrO_2$, a compound ($TiO_2/WO_3$) of $TiO_2$ and $WO_3$, a compound of ($WO_3/Fe_2O_3$) of $WO_3$ and $Fe_2O_3$, a compound ($WO_3/ZrO_2$) of $WO_3$ and $ZrO_2$, a compound ($WO_3/SnO_2$) of $WO_3$ and $SnO_2$, a compound ($WO_3/SiO_2$) of $WO_3$ and $SiO_2$, and a compound ($SiO_2/Al_2O_3$) of $SiO_2$ and $Al_2O_3$.

The weight ratio of $WO_3$ and $SiO_2$ is preferably 1:1.

As another preferable feature, the photocatalyst included in the photocatalyst layer may be a selected one from a titanium dioxide photocatalyst and a visible-light-responsive titanium dioxide photocatalyst.

Here, for example, the visible-light-responsive titanium dioxide photocatalyst is obtained by doping or containing metal or non-metal atoms other than atoms basically included in a titanium dioxide photocatalyst on the titanium dioxide photocatalyst. For another example, the visible-light-responsive titanium dioxide photocatalyst is obtained by changing the stoichimetric ratio of a titanium dioxide photocatalyst in which the ratio of Ti (titanium atoms) and O (oxygen atoms) are included in a ratio of 1:2.

A titanium dioxide photocatalyst of anatase structure is as high as 3.2 eV in band-gap energy and is activated by light having a wavelength of 380 nm or shorter. Setting of an impurity level in the band-gap energy lowers the band-gap energy so that the visible-light-responsive titanium dioxide photocatalyst can utilize light having a wavelength of 600 nm or shorter as activating light.

To attain the first object, as a third generic feature, there is provided a method for making a layered formation with one or more of the above features, comprising the step of: after forming of the intermediate layer on the substrate, forming the photocatalyst layer on the intermediate layer.

As a fourth generic feature, there is provided a printing plate on which an image is formed and deleted by irradiating with activating light having energy higher than a band-gap energy of a photocatalyst so that the image is formed on the printing plate without performing a wet development process and the printing plate is repetitiously reused, the printing plate comprising: a substrate; a photocatalyst layer including the photocatalyst; and an intermediate layer including two or more kinds of oxide semiconductors and being formed between the substrate and the photocatalyst layer, so that charge separation efficiency of the photocatalyst layer is improved.

It is thereby possible to enhance catalytic activity of the photocatalyst whereupon irradiation with light having a lower irradiation energy rapidly hydrophilizes the surface of the photocatalyst layer.

Namely, rapid formation of an image on the surface of the printing plate by irradiating with the activating light can shorten the time required to make the printing plate and rapid deleting of the formed image by irradiating the activating light can shorten the time required to regenerate the printing plate. As a result, it is possible to further shorten printing preparation time.

Reuse of a regenerated printing plate can greatly reduce waste discarded after performing printing of an image, thereby reducing printing plate costs.

To attain the first object, as a fifth generic feature there is provided a printing plate on which an image is formed and deleted by irradiating with activating light having energy higher than a band-gap energy of a photocatalyst so that the image is formed on said printing plate without performing a wet development process and said printing plate is repetitiously reused, said printing plate comprising: a substrate; a photocatalyst layer including the photocatalyst; and an intermediate layer including a solid acid and being formed between said substrate and said photocatalyst layer.

It is thereby possible to enhance catalytic activity of the photocatalyst whereupon irradiation with light having a lower irradiation energy rapidly hydrophilizes the surface of the photocatalyst layer.

Namely, rapid forming of an image on the surface of the printing plate by irradiating with the activating light can shorten the time required to make the printing plate and rapid deleting of the formed image by irradiating the activating light can shorten the time required to regenerate the printing plate. As a result, it is possible to further shorten the time for preparing printing.

Reuse of a regenerated printing plate can greatly reduce waste discarded after printing of an image, thereby reducing cost for a printing plate.

As a preferable feature, the surface of the photocatalyst layer in a hydrophobic state may be hydrophilized when the image is formed and deleted. Irradiation of one or more portions of the surface of the photocatalyst layer (the surface of the printing plate) in a hydrophobic state with the activating light hydrophilizes the one or more portions whereupon a hydrophobic image area and a hydrophilic non-image area form an image on the surface of the printing plate. Further, irradiating the entire surface of the printing plate with the activating light hydrophilizes the entire surface to delete the formed image so that regeneration of the printing plate can be executed.

As another preferable feature, the activating light may have a wavelength of 600 nm or shorter. As a result, it is possible to form an image using light of a wavelength of ultra-violet light to visible light, in other words, the activating light can be selected from various alternatives.

As an additional preferable feature, the surface of the photocatalyst layer may be hydrophobized by one from irradiating the surface of the photocatalyst layer with energy fluxes of one from light, electricity, and a combination of light and electricity, creating friction on the surface of the photocatalyst layer, applying an organic compound able to interact with the surface of the photocatalyst layer onto the surface of the photocatalyst layer. The surface of the photocatalyst layer in a hydrophobic state is hydrophilized simply by irradiating with the activating light, so that an image comprising a hydrophobic image area and a hydrophilic non-image area can be surely formed.

As a sixth generic feature, there is provided a method for making a printing plate which includes a photocatalyst layer including a photocatalyst and on which an image is formed and deleted by irradiating with activating light having energy higher than a band-gap energy of the photocatalyst so that the image is formed on the printing plate without performing a wet development process and the printing plate is repetitiously reused, the method comprising the steps of:

(a) forming an intermediate layer including two or more kinds of oxide semiconductors on the surface of a substrate; and (b) forming the photocatalyst layer including the photocatalyst on the surface of the intermediate layer.

It is thereby possible to enhance catalytic activity of the photocatalyst so that a printing plate whose surface including the photocatalyst is rapidly hydrophilized by irradiation with light having a lower irradiation energy can be made.

Rapid forming of an image on the surface of the photocatalyst layer (the printing plate) by irradiating with the activating light can shorten the time required to make the printing plate and rapid deleting of the formed image by irradiating the activating light can shorten the time required to regenerate the printing plate. As a result, it is possible to further shorten printing preparation time.

Reuse of a regenerated printing plate can greatly reduce waste discarded after performing printing of an image, reducing cost for a printing plate.

As a preferable feature, the step (a) of forming the intermediate layer may be performed by applying a sol solution including the two or more kinds of oxide semiconductors on the substrate and then hardening the sol solution; and the step (b) of forming the photocatalyst layer may be performed by applying a sol solution including the photocatalyst on the intermediate layer and then hardening the last-named sol solution.

As another preferable feature, the step (a) of forming the intermediate layer may be performed by sputtering using the two or more kinds of oxide semiconductors; and the step (b) of forming the photocatalyst layer may be performed by sputtering using the photocatalyst in order to form a layer including the phtocatalyst and then baking the last-named layer.

To attain the first object, as a seventh generic feature, there is provided a method for making a printing plate which includes a photocatalyst layer including a photocatalyst and on which an image is formed and deleted by irradiating with activating light having energy higher than a band-gap energy of the photocatalyst so that the image is formed on the printing plate without performing a wet development process and the printing plate is repetitiously reused, the method comprising the steps of: (a) forming an intermediate layer including a solid acid on the surface of a substrate; and (b) forming the photocatalyst layer including the photocatalyst on the surface of the intermediate layer.

It is thereby possible to enhance catalytic activity of the photocatalyst so that a printing plate whose surface including the photocatalyst is rapidly hydrophilized by irradiation with light having a lower irradiation energy can be made.

Rapid forming of an image on the surface of the photocatalyst layer (the printing plate) by irradiating with the activating light can shorten the time required to make the printing plate and rapid deleting of the formed image by irradiating the activating light can shorten the time required to regenerate the printing plate. As a result, it is possible to further shorten the time for preparing printing.

Reuse of a regenerated printing plate can greatly reduce waste discarded after performing printing of an image, thereby reducing printing plate costs.

To attain the second object, as an eighth generic feature, there is provided a printing press comprising: a plate cylinder around which a printing plate having the fourth or fifth generic feature is mounted; a hydrophobizing unit for hydrophobizing the surface of the photocatalyst layer; an imaging unit for forming an image on the surface of the photocatalyst layer in a hydrophobic state by irradiating with activating light having a wavelength of 600 nm or shorter; a plate cleaning unit for removing remaining ink applied to the surface of the photocatalyst layer after printing of the image formed by the imaging unit is completed; and an image deleting unit for hydrophilizing the surface of the photocatalyst layer by irradiating the surface of the photocatalyst layer with the activating light so that the image formed by the imaging unit is deleted after the plate cleaning unit removes the remaining ink. With this configuration, the printing plate can be made and regenerated with the printing plate mounted on the printing press. Printing performance is thereby improved because there is no need to change the printing plate.

As a result, since the activating light has a wavelength of 600 nm or shorter it is possible to write an image using light of a wavelength of ultra-violet light to visible light, in other words, the activating light can be selected from various alternatives.

Reuse of a regenerated printing plate can greatly reduce waste discarded after performing printing of an image, thereby reducing printing plate costs.

Other objects and further features of the present invention will be apparent from the following detailed description when read in conjunction with the accompanying drawings.

DESCRIPTION OF THE PREFERRED EMBODIMENTS

Various preferred embodiments of the present invention will now be described with reference to the accompanying drawings.

(A) First Embodiment

Figure 1:
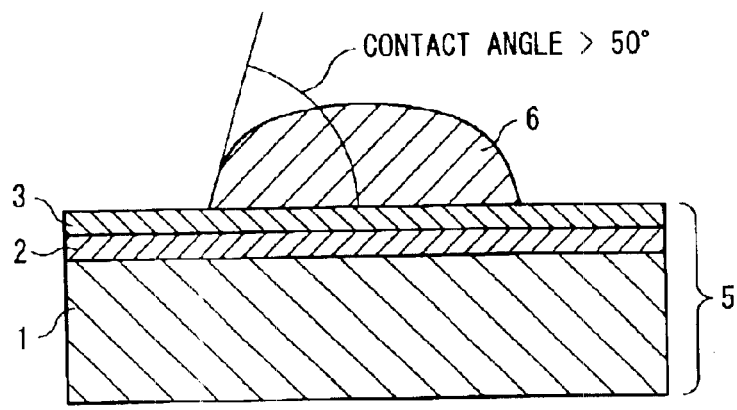
FIG. 1 is a sectional view illustrating the surface of a layered formation in a hydrophobic state according to a first embodiment of the present invention.
Figure 2:
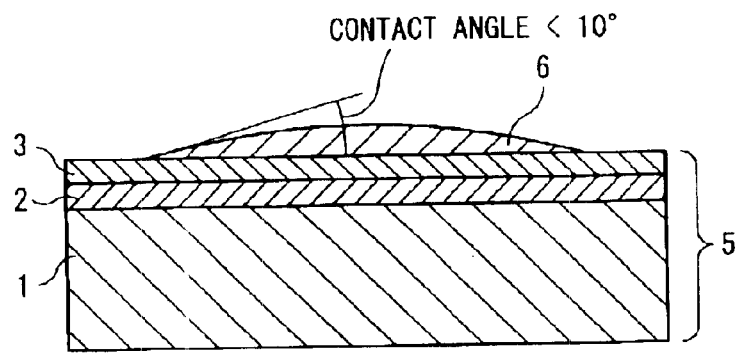
FIG. 2 is a sectional view illustrating the surface of the layered formation in a hydrophilic state according to the first embodiment.

FIGS. 1 and 2 show a layered formation according to a first embodiment: FIG. 1 is a sectional view illustrating the layered formation in a hydrophobic state; and FIG. 2 is a sectional view illustrating the layered formation in a hydrophilic state.

As shown in FIG. 1, layered formation 5 basically includes substrate (or supporting member) 1, intermediate layer 2, and photocatalyst layer (photosensitive layer) 3 including a photocatalyst.

Substrate 1 is made of sheet metal such as aluminum or stainless steel, a polymer film or the like. It is, however, to be noted that the material of the substrate 1 shall not be limited to the above examples. Therefore, the material may be selected considering flexibility, surface hardness, heat conductivity, electric conductivity, and durability suitable for forming photocatalyst layer 3 on substrate 1.

Photocatalyst layer 3 includes a titanium dioxide photocatalyst.

Irradiation with activating light having energy higher than a band-gap energy of the photocatalyst causes photocatalyst layer 3 to decompose an organic compound applied on the surface of photocatalyst layer 3 and change into a high hydrophilic state at the same time.

A photocatalyst is not activated unless being irradiated with light having energy higher than the band-gap energy thereof. For example, since a titanium dioxide photocatalyst of anatase structure is as high as 3.2 eV in band-gap energy, the photocatalyst responds only to ultraviolet light having a wavelength up to 380 nm. An energy level newly set between the band gaps allows the present embodiment to utilize a photocatalyst responsive also to activating light having a wavelength of 600 nm or shorter. Activating light having a wavelength up to 600 nm of course includes ultraviolet light, although the activating light may not include ultraviolet light. Namely, the photocatalyst utilized in the present invention responds to activating light excluding ultraviolet light.

Executing a method already known produces a photocatalyst responsive to visible light. For example, Japanese Patent Laid-Open (KOKAI) Publication No. 2001-207082 discloses a visible-light-responsive photocatalyst obtained by doping nitrogen atoms; Japanese Patent Laid-Open (KOKAI) Publication No. 2001-205104, a visible-light-responsive photocatalyst obtained by doping chromium and nitrogen atoms; and further Japanese Patent Laid-Open (KOKAI) Publication No. HEI 11-197512, a visible-light-responsive photocatalyst obtained by ion implantation using metal ions, such as chromium ions. A visible-light-responsive photocatalyst is generated by another disclosed method in which cryogenic plasma is utilized. A visible-light-responsive photocatalyst containing platinum is also disclosed. The photocatalyst (for example, a visible-light responsive titanium dioxide photocatalyst (a visible-light-responsive titanium dioxide material)) of so-called visible-light-responsive type, which is obtained by execution of one of the above-disclosed methods, is used to make layered formation 5 of the present embodiment.

Here, for example, the visible-light-responsive titanium dioxide photocatalyst is obtained by doping or containing metal or non-metal atoms other than atoms basically included in a titanium dioxide photocatalyst on the titanium dioxide photocatalyst. As another example, the visible-light-responsive titanium dioxide photocatalyst is obtained by changing the stoichimetric ratio of a titanium dioxide photocatalyst in which the ratio of Ti (titanium atoms) and O (oxygen atoms) are included in a ratio 1:2.

In order to improve the above properties, hydrophilicity, the adhesion between substrate 1 and intermediate layer 2, and the strength of photocatalyst layer 3, photocatalyst layer 3 including a visible-light responsive photocatalyst may further include the following substance, such as a silica compound exemplified by silica, silica sol, organosilane, or a silicone resin, a metal oxide or a metal hydride exemplified by zirconium, aluminum, titanium, or a fluorine resin.

The crystal structure of titanium dioxide photocatalyst is available in rutile, anatase and brucite. These structures are all usable in this embodiment, and they may be used in combination. The anatase structure, which has the highest activity among the three structures, is preferred, considering photocatalytic activity.

In order to enhance the photocatalytic activity that decomposes an image area under irradiation with the activating light as will be described subsequently, a preferable titanium dioxide photocatalyst is small in particle diameter around a certain level. Specifically, the particle size of a titanium dioxide photocatalyst is 0.1 $\mu$m or smaller, with a particle diameter of not greater than 0.05 $\mu$m being more preferred. It is to be noted that the photocatalyst shall not be limited to the titanium dioxide photocatalyst, although the titanium dioxide photocatalyst is preferable.

The thickness of photocatalyst layer 3 is preferably in a range of from 0.005 to 1 $\mu$m because an unduly small thickness makes it difficult to fully utilize the above-described properties while an excessively large thickness makes photocatalyst layer 3 susceptible to crazing and causes a reduction in plate wear durability. As this crazing is pronouncedly observed when the thickness exceeds 10 $\mu$m, it is necessary to consider this 10 $\mu$m as an upper limit even if one tries to enlarge this range of thickness. In practice, this thickness may preferably be set in a range of from 0.03 to 0.5 $\mu$m or so.

Intermediate layer 2 is formed between substrate 1 and photocatalyst layer 3. The Inventors of the present invention have discovered intermediate layer 2 including two or more kinds of oxide semiconductors concurrently improves hydrophilization of the photocatalyst included in photocatalyst layer 3 and decomposition of an organic compound by the photocatalyst under irradiation with the activating light.

Intermediate layer 2 of printing plate 5 is featured by including two or more kinds of oxide semiconductors. In the illustrated example, intermediate layer 2 (also called an "oxide" layer because the layer includes oxides) includes tungsten trioxide and tin dioxide.

Intermediate layer 2 may include two or more kinds of oxide semiconductors selected from tungsten trioxide ($WO_3$) , tin dioxide ($SnO_2$), chromicoxide ($Cr_2O_3$), vanadium pentoxide ($V_2O_5$), molybdenum trioxide ($MoO_3$), antimony(III) oxide ($Sb_2O_3$), ferric oxide ($Fe_2O_3$), cuprous oxide ($Cu_2O$), and niobium(V) oxide ($Nb_2O_5$). The oxide semiconductors to be included in intermediate layer 2 should be by no means limited to the above examples, of course.

It is still unclear why intermediate layer 2 including two or more kinds of oxide semiconductors improves the catalysis of the photocatalyst. The Inventors estimate that such oxide semiconductors inhibit positive holes and electrons, which are generated by irradiation with the activating light, from re-combining with electrons whereby charge separation efficiency is improved.

If substrate 1 is made of a polymer film, intermediate layer 2 protects substrate 1. When conducting heat treatment for formation of photocatalyst layer 3 to be described subsequently, intermediate layer 2 is also effective for preventing impurities included in the substrate 1 from thermodiffusing and from thereby mixing into photocatlyst layer 3, so that a reduction in photocatalytic activity is avoided.

Intermediate layer 2 is formed by selecting one of a sol coating process, an organic titanate process, a sputtering process, a CDV process, a PVD process or the like. In particular, the sol coating process is preferable because of the simplicity in forming intermediate layer 2 including two or more kinds of oxide semiconductors. If the sol coating process is adopted, for example, a sol coating formulation employed for use in the sol coating process may contain a solvent, a crosslinking agent, a surfactant and the like, in addition to titanium dioxide at least one of the above-described substances, so that the strength of a titanium dioxide photocatalyst layer 3 and adhesion between substrate 1 and photocatalyst layer 3 are improved. The coating formulation may be either a room temperature drying type or a heat drying type, with the latter being more preferred because, in order to provide the resultant layered formulation 5 with improved wear durability if layered formulation 5 is to be used for a printing plate, it is advantageous to enhance the strength of photocatalyst layer 3 by heating.

If intermediate layer 2 and photocatalyst layer 3 are formed by a sol coating process, a sol solution including oxide semiconductors is applied on the surface of substrate 1 and then the solution is hardened to thereby form intermediate layer 2 (the intermediate layer forming process). After that, a sol solution including the photocatalyst is applied on the surface of intermediate layer 2 and then hardened to thereby form photocatalyst layer 3 (the photocatalyst layer forming process).

Alternatively, a sputtering process may be performed using two or more kinds of oxide targets to form intermediate layer 2 on substrate 1 (the intermediate layer forming process) and then another sputtering process may be performed using a target including the photocatalyst to form photocatalyst layer 3 on the intermediate layer 2 and the formation is baked (the photocatalyst layer forming process). Since the two sputtering processes make the surface membrane of layered formulation 5 stronger, layered formulation 5 provides high durability in printing when used as a printing plate.

A protection layer including a photocatalyst responsive to light having a wavelength of 380 nm or shorter may be formed on the layer (photocatalyst layer 3) including the photocatalyst responsive to light having a wavelength of 600 mn or shorter, i.e., the activating light of the present invention, or a silica layer may be formed on photocatalyst layer 3 to maintain hydrophilicity of photocatalyst layer 3. Alternatively, layered formation 5 of the present invention may include such a protection layer or a silica layer.

As mentioned above, layered formulation 5 including photocatalyst layer 3 of the present invention is basically used as a printing plate. If substrate 1 is made of aluminum, a so-called graining process may be performed on the substrate 1 by anodic oxidation to make the surface rough, if necessary, so that substrate 1 is improved to become suitable for a printing plate. Layered formulation 5 including photocatalyst layer 3 may be therefore used as a printing plate without performing an extra process or with previously performing a graining process on the surface of substrate 1.

Further, since layered formulation 5 of the present invention has an improved ability to oxidize and decompose an organic compound and an improved hydrophilicity of the photocatalyst, layered formulation 5 can be used as an outer wall of a building or a construction, a wall of a room, a tile, and window glass because of an advantage that dirt does not adhere to the surface.

When layered formulation 5 is used as a printing plate, a preferable organic compound for hydrophobizing photocatalyst layer 3 hydrophobizes the surface of photocatalyst layer 3 by reacting and strongly interacting with the surface of photocatalyst layer 3 only by being applied and dried at room temperature or by heat if necessary, and is decomposed by the photocatalyst to be removed from the surface of photocatalyst layer 3.

Preferable organic compounds are an organic titanium compound, an organic silane compound, an isocyanate compound, and an epoxide compound. These organic compounds respectively react with hydroxy groups present at the surface of photocatalyst layer 3 and are fixed to the surface. As a result, an organic compound monomolecular layer (non-illustrated) is formed on the surface of photocatalyst layer 3 in principle, which monomolecular layer hydrophobizes the surface of photocatalyst layer 3, thereby facilitating decomposition of the organic compound under irradiation with the activating light.

An organic titanium compound is exemplified by (1) alkoxy titanium, such as tetra-i-propoxy titanium, tetra-n-propoxy titanium, tetra-n-butoxy titanium, tetra-i-butoxy titanium or tetrastearoxy titanium, (2) titanium acylate, such as tri-n-butoxy titanium stearate orisopropoxytitanium tristearate, or (3) titanium chelate, diisopropoxy titanium bisacetylacetonate, dihydroxy bislactato titanium or titanium-i-propoxyoctylene glycol. But the organic titanium compound should be by no means limited to the above examples.

An organic silane compound is (1) alokoxysilane exemplified by trimethylmethoxysilane, trimethylethoxysilane, dimethyldiethoxysilane, methyltrimethoxysilane, tetramethoxysilane, methyltriethoxysilane, tetraethoxysilane, methyldimethoxysilane, octadecyltrimethoxysilane or octadecyltriethoxysilane, (2) chlorosilane, such as trimethylchlorosilane, dimethyldichlorosilane, methyletrichlorosilane, methyledichlorosilane or dimethylchlorosilane, (3) a silane coupler, such as vinyltrichlorosilane, vinyl-triethoxysilane, γ-chloropropyltrimethoxysilane, γ-chloropropylmethyldichlorosilane, γ-chloropropylmethyldimethoxysilane, γ-chloropropylmethyldiethoxysilane or γ-aminopropyltriethoxysilane, or (4) pholoroalkylsilane exemplified by perpholoroalkylrtimethoxysilane, but should by no means be limited to those examples.

An isocyanate compound is exemplified by isocyanicdodecyl, isocyanicoctadecyle or the like, but should not be limited to those compounds.

An epoxide compound is exemplified by 1,2-epoxydecane, 1,2-epoxyhexadecane, or 1,2-epoxyoctadecane, but should be by no means limited to those examples.

Each of the above organic compounds coats photocatalyst layer 3 by performing of a dip coating, a roll coating, and/or a blade coating if the compound is liquid at room temperature. Alternatively, photocatalyst layer 3 may be coated with microdrops of the organic compound, which microdrops are formed by a spray. Further, photocatalyst layer 3 may be coated with the organic compound in the form of gas obtained by heating the compound to a temperature below the decomposition temperature or in the form of vapor formed by a nebulizer utilizing ultrasound. Needless to say, the compound may be resolved in another solution in order to adjust its concentration and viscosity.

A succession of procedural steps of making and regenerating layered formulation 5 when layered formulation 5 is used as a printing plate according to the first embodiment will now be described. Accordingly, layered formulation 5 is also called "printing plate" 5.

Figure 3:
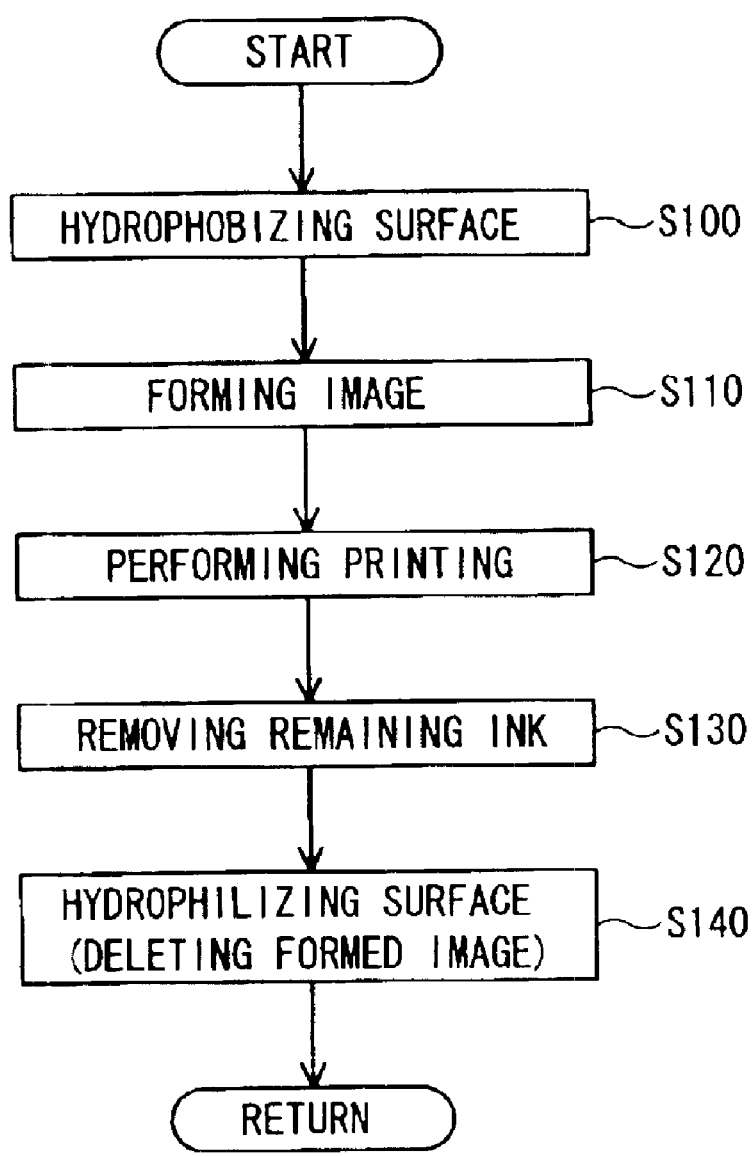
FIG. 3 is a flow diagram illustrating a succession of procedural steps of making and regenerating a layered formation according to the first embodiment.

As shown in FIG. 3, making and regenerating of printing plate 5 comprises the succession of procedural steps of hydrophobizing the surface (step S100), forming an image (imaging) (writing (inscribing) a non-image area) (step S110), performing printing (step S120), removing remaining ink (step S130), and hydrophilizing the surface (deleting the formed image) (step S140).

First of all, the procedural steps of making a printing plate will now be described.

Hereinafter, "making of a printing plate" means to form a hydrophilic non-image area by irradiating at least part of the surface of printing plate 5 (i.e., photocatalyst layer 3) in a hydrophobic state (the initial state) with light (the activating light) having a wavelength shorter than that of visible light on the basis of the digital data. Whereby, a combination of the hydrophilic non-image area and a hydrophobic image area, which is not irradiated with the activated light, forms a latent image on the surface of printing plate 5.

Figure 4:
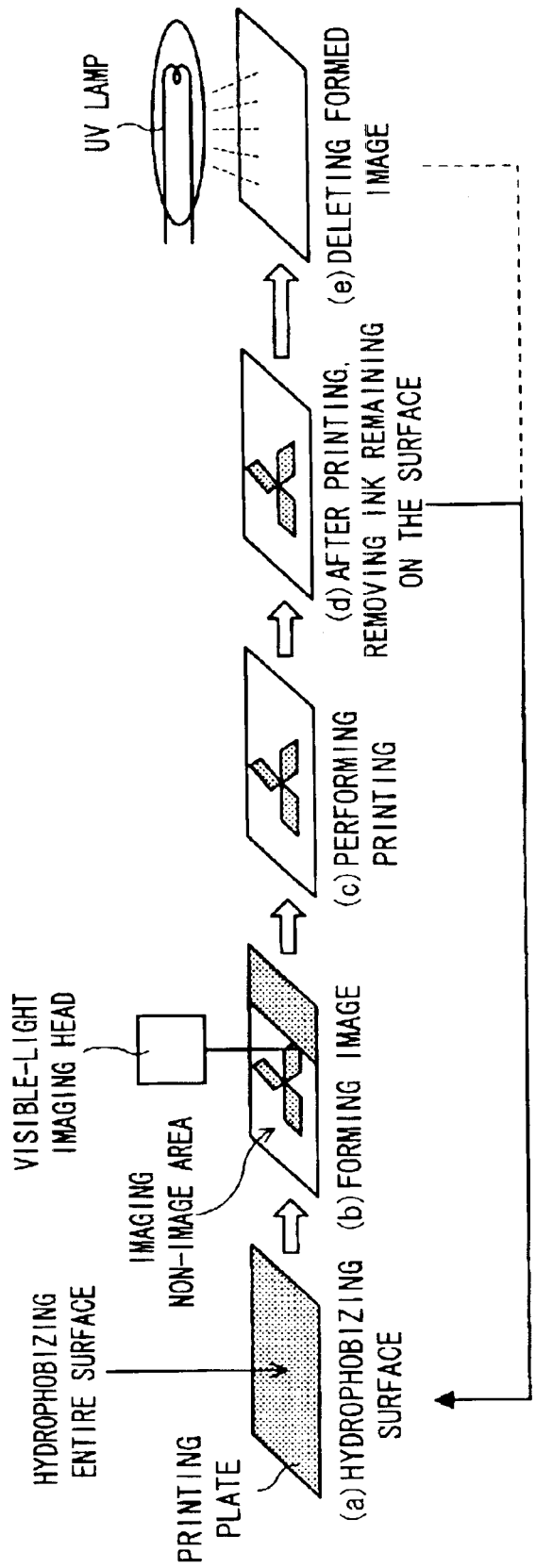
FIG. 4 is a perspective diagram illustrating a cycle of operations from image formation on a layered formation to regenerating the layered formation according to the first embodiment.

As shown in (a) of FIG. 4, the surface of photocatalyst layer 3, whose entire surface is hydrophilized in the prior cycle of the procedural step (of hydrophilizing the surface) is hydrophobized in the step of hydrophobizing.

Hydrophobization of the surface of photocatalyst layer 3 is performed by applying an organic compound able to be decomposed by the photocatalyst when irradiated with the activating light onto the surface of photocatalyst layer 3, by irradiating the surface of photocatalyst layer 3 with energy fluxes of light and/or electricity, or by rubbing (creating friction on) the surface of photocatalyst layer 3 to provide the surface of photocatalyst layer 3 with mechanical energy, such as friction.

Further, (a) of FIG. 4 illustrates the surface of printing plate 5 in the initial state, whose entire surface is hydrophobized. Here, the surface of printing plate 5 in a hydrophobic state has a contact angle of 50° or greater, preferably, 80° or greater against water 6 thereon, which is in such a state that a hydrophobic printing ink is held with ease but the fountain solution is hardly deposited.

This state of the surface of the photocatalyst layer 3 will be called" the initial state in the making of the printing plate". More specifically, the "initial state in the making of the printing plate" can be considered to indicate a state in which the digitized data representing a desired image has already been provided and is about to be formed onto the surface printing plate 5.

Subsequently, a non-image area is written onto the hydrophobic surface of photocatalyst layer 3 in a hydrophobic state, at the step of forming an image (an imaging step), as shown in (b) of FIG. 4.

A non-imaged area is written onto photocatalyst layer 3 in accordance with the digital data representing the desired image. The non-image area, as shown in FIG. 2, is hydrophilic and thereby has a contact angle up to 10° of water 6 on the surface of printing plate 5, which is in such a state that the fountain solution easily adheres but printing ink is hardly deposited.

In order to form a hydrophilic non-image area based on the digital data, photocatalyst layer 3 having a photocatalyst exhibits a photocatalytic activity responsive to irradiation with light having a wavelength of 600 nm or shorter, i.e., activating light, is partially irradiated with the activating light so that the one or more irradiated portions of photocatalyst layer 3 is hydrophilized. On the other hand, one or more portions of the surface of photocatalyst layer 3, which portions are not irradiated with the activating light, remain hydrophobic so that the surface of printing plate 5 includes one or more hydrophobic and hydrophilic portions so that printing plate 5 can be made.

In (b) of FIG. 4, an imaging head utilizing visible light, for example, violet laser having a wavelength of 405 nm, writes a non-image area to thereby form non-image area 3*a* on the surface of photocatalyst layer 3, which has been in a hydrophobic state.

An alternative imaging head to form a hydrophilic non-image area in accordance with the digital image data other than the one utilizing violet laser having a wavelength of 405 nm may be any type and shape utilizing activating light to write image exemplified by an imaging head equipped with a light source to emit light of wavelengths of 360 to 450 nm and a micro-mirror whose product name is the UV-SETTER™ 710 manufactured by German company BasysPrint GmbH.

After completion of the step of forming an image, image and non-image areas are already formed on the surface of the photocatalyst layer 3, as shown in (c) of FIG. 4 whereupon a desired image is ready to be printed in the subsequent step of performing printing.

At the step of performing printing, a so-called emulsion ink of a mixture of a hydrophobic printing ink and the fountain solution is applied onto the surface of printing plate 5.

Figure 5:
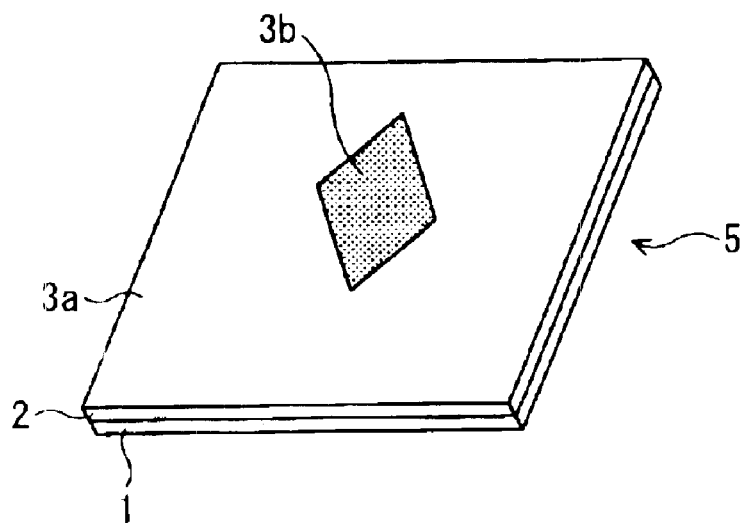
FIG. 5 is a perspective diagram schematically illustrating an example of a layered formation according to the first embodiment.

As a result of applying an emulsion ink onto the surface illustrated in FIG. 5, the hatching portion (that is, the hydrophobic image area) 3*b* holds the hydrophobic printing ink; and the remaining white portion (that is, the hydrophilic non-image area) 3*a* holds the foundation solution while the hydrophobic ink is repelled so that the ink is not deposited on the non-image area. Photocatalyst layer 3 on which the formed image (a printing pattern) emerges functions as printing plate 5. After that, the image is printed on paper to accomplish the step of performing usual printing.

Processes of regenerating a printing plate will now be described.

"Regeneration of the printing plate" will hereinafter mean to make the printing plate 5, whose surface partially shows hydrophobicity with the remaining part showing hydrophilicity, restore "the initial state in the making of the printing plate" by evenly hydrophilizing the entire surface of photocatalyst layer 3 and then by applying the organic compound to be decomposed by irradiation with the activation light because of activity of the photocatalyst onto the photocatalyst layer 3, by irradiating the surface of photocatalyst layer 3 with energy fluxes of light and/or electricity, or by rubbing the surface of photocatalyst layer 3 to provide the surface of photocatalyst layer 3 with mechanical energy. Thereby the surface of photocatalyst layer 3 in a hydrophilic state (i.e., a surface property of the photocatalyst) changes to hydrophobic so that printing plate 5 is restored to the initial state in making of the printing plate.

First of all, the step of removing remaining ink is started by removing ink, the fountain solution, and paper dust remaining on the surface of photocatalyst layer 3, which has completed printing. Removal of remaining ink is carried out by being moved to paper after supply of ink onto the surface of printing plate 5 is stopped, by wiping off using a reeling cloth tape, by wiping off using a roller around which cleaning cloth is wrapped, by spraying cleaning solvent onto the surface of printing plate 5 to wash off, or the like.

After that, at the step of hydrophilizng, the entire surface of photocatalyst layer 3 is irradiated with the activating light so that, in addition to non-image area 3*a*, image area 3*b* is also hydrophilized, as shown in (e) of FIG. 4. Whereupon, the entire surface of photocatalyst layer 3 is hydrophilized to have a contact angle up to 10° against water 6. In other words, the entire surface regains the state of FIG. 2, so that image area 3*b* is completely deleted.

With the presence of a titanium dioxide pholocatalyst or another proper photocatalyst, irradiation with the activating light can change the hydrophobic image area on the surface of photocatalyst layer 3 to show a high hydrophilicity. In the illustrated example as shown in (e) of FIG. 4, irradiation with ultraviolet light emitted from an ultraviolet lamp changes the hydrophobic image area into a hydrophilic state whereby the entire surface of photocatalyst layer 3 becomes hydrophilic in order to delete the formed image.

At the same time, the surface of photocatalyst layer 3 may be heated in addition to being irradiated with the activating light. Specifically, heating of the surface of photocatalyst layer 3 under irradiation with the activating light enhances the decomposition of the organic compound applied to the surface of photocatalyst layer 3 whereupon the entire surface of photocatalyst layer 3 can be hydrophilized in a shorter time. A preferred manner to heat the surface of photocatalyst layer 3 is performed by blowing hot air onto the surface or by irradiating the surface with light. The preferred irradiation light is infrared light, in consideration of heat efficiency.

In the subsequent step of hydrophobizing the surface, the photocatalyst is changed from hydrophilic to hydrophobic by performing one from irradiating the surface of printing plate 5 with energy fluxes of light and/or electricity, rubbing the surface of printing plate 5 to apply mechanical energy to printing plate 5, and applying a hydrophobic organic compound to the surface of printing plate precursor 5 so that printing plate 5 is returned to the initial state in making of the printing plate.

The step of hydrophilizing the surface is carried out in order to completely delete an image formed on printing plate 5. If the remaining ink is removed to an extent that does not affect the printing result of a next image, the step of hydrophilizing the surface can be omitted and the step of hydrophobizing the surface is performed upon completion of the step of removing the remaining ink.

Figure 6:
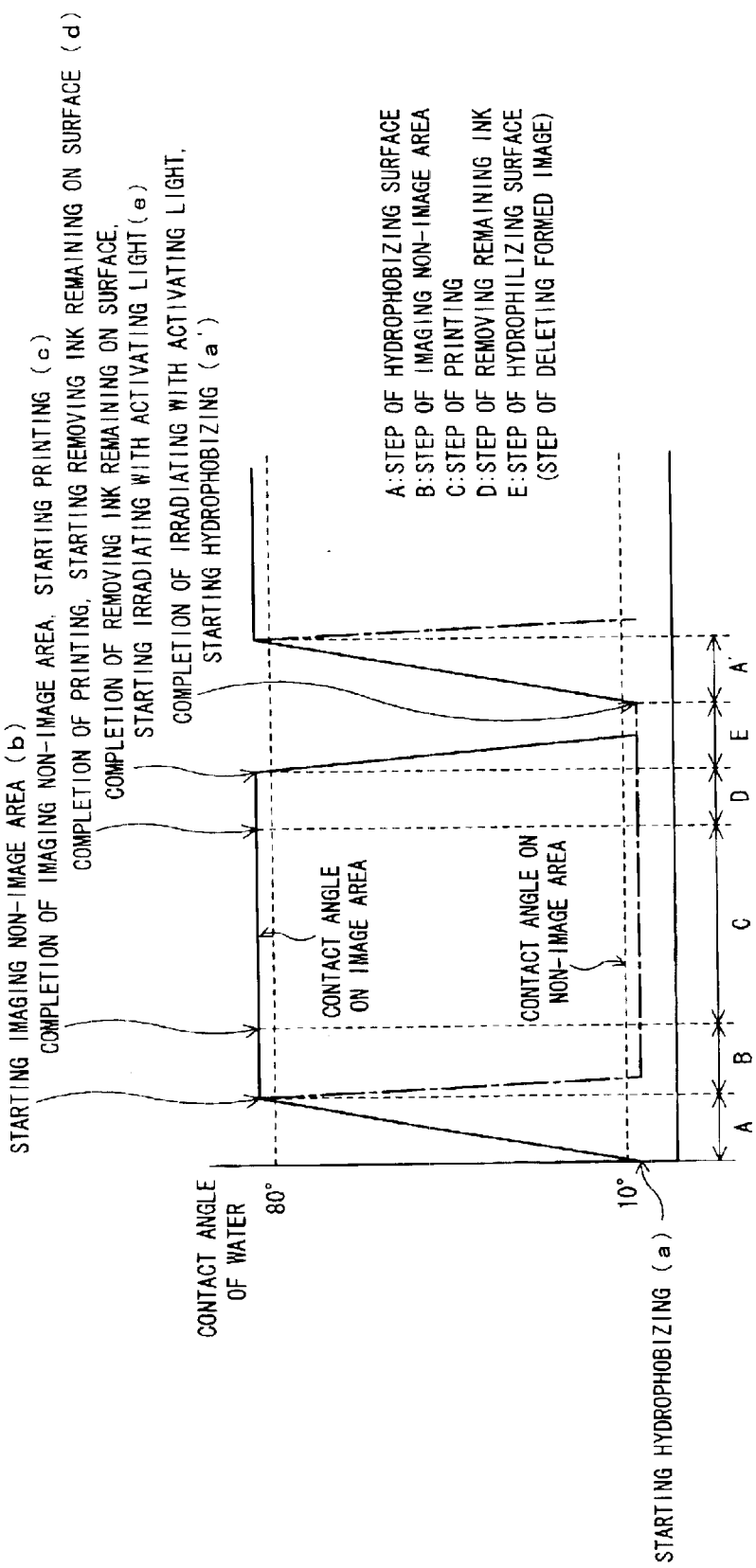
FIG. 6 is a graph showing a relationship between a contact angle defined in terms of a layered formation and water thereon and time (or procedural steps) according to the first embodiment.

FIG. 6 illustrates all of the steps described above. The abscissa represents time (the procedural steps); and the ordinate, the contact angle of water 6 on the surface of printing plate 5. The graph indicates the change of the contact angle of water 6 applied on the surface of photocatalyst layer 3 in accordance with the passage of time, in other words performance of the procedural steps. The one-dotted line in the graph represents the contact angle of water 6 on non-image area 3a of photocatalyst layer 3; and the solid line, that on image area 3b.

First of all, the surface of photocatalyst layer 3 is irradiated with the activating light to be in a high hydrophilic state in which the contact angle against water 6 is up to 10°.

In the step of hydrophobizing the surface (Step A in FIG. 6), the surface of printing plate 5 changes from hydrophilic to hydrophobic by performing one from irradiating the surface of printing plate 5 with energy fluxes of light and/or electricity, rubbing the surface of printing plate 5 to apply mechanical energy to printing plate 5, and applying a hydrophobic organic compound to the surface of printing plate 5. Namely, the surface of photocatalyst layer 3 in a hydrophobic state has a contact angle of 50° or greater, preferably, 80° or greater against water 6 thereon. Time point (a) in FIG. 6 indicates the start of hydrophobization, and time point (b) indicates completion of hydrophobization at which printing plate 5 is in "the initial state in the making of the printing plate."

The surface of photocatalyst layer 3 is irradiated with the activating light in order to start writing the non-image area on the surface at time point (b) in the next step of forming an image (step of writing a non-image area; Step B in FIG. 6). Thereby, one or more portions of the surface of photocatalyst layer 3, which portions have been irradiated with the activating light, change from hydrophobic to hydrophilic due to the activity of the photocatalyst so that the portions in a hydrophilic state have a contact angle up to 10° against water 6. On the other hand, the remaining one or more portions which have not been irradiated with the activating light maintain hydrophobicity whereupon the remaining portions become a hydrophobic image area. Photocatalyst layer 3 is composed of a combination of a non-image area including one or more portions which have been irradiated with the activating light and the image area serves to function as a printing plate.

After completion of writing the non-image area, printing is started to accomplish the step of performing printing (Step C in FIG. 6) (at time point (c) in FIG. 6).

Further, upon completion of printing, ink, dust or the like remaining on photocatalyst layer 3 is removed in an ink removal step (step D in FIG. 6) (at time point (d) in FIG. 6).

After completion of removing ink, the step of hydrophilizing the surface (step E in FIG. 6) is performed by irradiating the surface of photocatalyst layer 3 with the activating light so that the hydrophobic image area is hydrophilized by the action of the photocatalyst and the entire surface of photocatalyst layer 3 returns to a hydrophilic state.

After that, in the step of hydrophobizing the surface (Step A' in FIG. 6), the surface of printing plate 5 returns to the initial state in the making of the printing plate (time point (a') in FIG. 6) for future reuse by one of irradiating the surface of printing plate 5 with energy fluxes of light and/or electricity, rubbing the surface of printing plate 5 to apply mechanical energy to printing plate 5, and applying a hydrophobic organic compound to the surface of printing plate 5.

Figure 7:
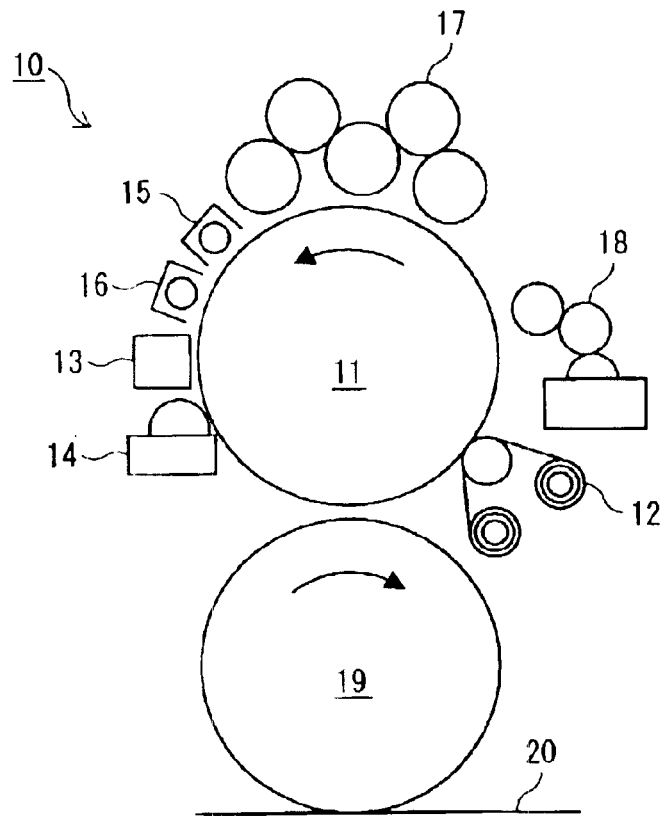
FIG. 7 is a diagram showing a printing press for printing an image formed on a layered formation and regenerating the layered formation according to the first embodiment.

The above printing and regenerating of a printing plate are preferably performed in print system (printing press) 10 shown in FIG. 7.

Printing press 10 comprises plate cylinder 11 disposed in the center thereof, and additionally includes plate cleaning unit 12, imaging unit 13, surface hydrophobizing unit 14, heating device 15, hydrophilizing activating light emitting unit 16 serving as an apparatus to delete a formed image, inking rollers 17, fountain solution feeder 18, and blanket cylinder 19, which are disposed around plate cylinder 11. Printing plate 5 is mounted around the surface of plate cylinder 11.

Methods of making and regenerating a printing plate will now be described with reference to FIG. 7. Plate cleaning unit 12 in contact with plate cylinder 11 wipes off ink, the fountain solution and paper dust remaining on the surface of printing plate 5. Plate cleaning unit 12 of FIG. 7 takes the form of a reeling cloth tape to wipe off ink, although plate cleaning unit 12 should be by no means limited to such a tape.

After wiping off, plate cleaning unit 12 is disengaged from plate cylinder 11, and then the surface of printing plate 5 is heated by heating device 15 and concurrently irradiated with the activating light by hydrophilizing activating light emitting unit 16 to be thereby hydrophilic. In the illustrated example, the activated light is ultraviolet light whose wavelength is up to 380 nm. Alternatively, if a photocatalyst included in photocatalyst layer 3 is activated by light having a wavelength of 400 nm to 600 nm, the activating light may be one having a wavelength of 400 nm to 600 nm.

Then, surface hydrophobizing unit 14 hydrophobizes the entire surface of printing plate 5. In FIG. 7, surface hydrophobizing unit 14 takes the form of a roller to apply a hydrophobic organic compound onto the surface but should by no means be limited to such a roller. As an alternative, surface hydrophobizing unit 14 may be substituted by a unit to irradiate the surface of printing plate 5 with energy fluxes of light and/or electricity, or to rub the surface of printing plate 5 to apply mechanical energy to printing plate 5.

Upon completion of the hydrophobization, imaging unit 13 irradiates one or more portions corresponding to the prepared digital image data with the activating light to write non-image area 3a on the printing plate 5 (namely, forming an image on the printing plate 5). The activating light to write a non-image area has a wavelength of 600 nm or shorter.

After that, inking rollers 17, the fountain solution feeder 18, and blanket cylinder 19 are moved so as to be in contact with plate cylinder 11, and paper 20 is disposed so as to be in contact with blanket cylinder 19. Plate cylinder 11 and blanket cylinder 19 respectively rotate in the directions of the respective arrows of FIG. 7 whereby the foundation solution and ink are applied onto printing plate 5, the formed image is printed on paper 20.

A succession of procedural steps for regenerating printing plate 5 can be completely performed by printing press 10 because printing press 10 comprises plate cleaning unit 12 to clean the surface of printing plate 5 mounted on plate cylinder 11, hydrophilizing activating light emitting unit 16 to delete an image area (a formed image) by irradiation with the activating light, organic compound applier 14 to apply the organic compound onto the surface of printing plate 5, heating device 15 to enhance hydrophilization of printing plate 5 by heating the surface of the printing plate, which plate cleaning unit 12, hydrophilizing activating light emitting unit 16, organic compound applier 14 and heating device 15 serve as an apparatus for regenerating a printing plate. Additionally included imaging unit 13 to form an image on printing plate 5 allows printing press 10 to execute the succession of procedural steps of making and regenerating printing plate 5 with printing plate 5 continuing to be mounted on plate cylinder 11. With this configuration, it is possible to continue printing without stopping printing press 10 or changing printing plate 5.

In the first embodiment, the activating light used to write a non-image area has a wavelength of 600 nm or shorter, which light can be easily obtained and handled.

Printing press 10 of the illustrated example includes printing plate 5 mounted around plate cylinder 11, although printing plate 5 should by no means be limited to this. Alternatively, photocatalyst layer 3 may be directly formed on plate cylinder 11, that is, plate cylinder 11 and printing plate 5 are joined together into an integrated form.

Hereinafter, a description is made in relation to printing plate 5, a succession of procedural steps of making and regenerating printing plate 5 according to the first embodiment with reference to the experiment results and observation by the Inventors.

Preparation of Catalyst:

The stirred Ammonia solution was added to starting material of a titanium sulfate (a product of Wako Pure Chemical Industries, Ltd.) to obtain titanium sulfate hydrolysate, which was filtered through a Buchner funnel. The residue titanium sulfate hydrolysate was washed with deionized water until an electrical conductivity of the filtrate came to be 2 $\mu$S/cm or smaller. After washing, the hydrolysate was dried at room temperature and then burned product in the atmosphere for two hours at 400° C. The burnt product was roughly milled with a mortar, so that a powder-form photocatalyst was obtained.

Confirmation of Visible-light Activity:

The above powder-form photocatalyst (0.2 g) was evenly spread over the bottom of a sealable cylindrical reaction container (500 ml) made of PYREX® glass. The atmosphere in the reaction container was deaerated and substituted with highly-purified air. Acetone (500 ppm) was added into the reaction container and was absorbed into the photocatalyst in a dark place for 10 hours at 25 until the contents in the reaction container reached absorption equilibrium. After that, the contents were irradiated with light (having the major wavelength of 470 nm) emitted from blue LED (produced by Nichia Corporation). As a result of a follow-up measurement on amounts of acetone and carbon dioxide ($CO_2$) using a gas chromatograph manufactured by Shimadzu Corporation, the Inventors have confirmed that irradiation with light emitted from the blue LED for 20 hours decomposed all acetone in the reacting container and generated carbon dioxide $CO_2$ whose amount corresponds to the stoichiometry proportion of the acetone. Namely, the Inventors confirmed that the powder-form photocatalyst was activated by light having a wavelength of 470 nm.

Making of a Printing Plate:

(a) Preparation of a Substrate:

Alkaline degreasing was performed on a stainless-steel (SUS301) board whose area was 280×204 mm and thickness was 0.1 mm to prepare substrate 1.

(b) Formation of an Intermediate Layer:

Ammonium paratungstate (a product of Wako Pure Chemical Industries, Ltd.) was dissolved into a methylamine solution (10 wt %, a product of Wako Pure Chemical Industries, Ltd.) whereby an ammonium pratungstate solution was prepared. An intermediate layer coating solution was prepared by mixing the ammonium pratungstate solution and a transparent conductive material SERAMACE S-8 (8 wt %, ultrafine powder of tin dioxide, product of TAKI CHEMICAL CO., LTD.) in a weight ratio of $WO_3$ to $SnO_2$ of 1:1. Substrate 1 was dip coated with the intermediate layer coating solution, air-dried, and burned for 1 hour at 500° C., so that intermediate layer 2 was formed. At that time, intermediate layer 2 had a thickness of 0.12 $\mu$m.

(c) Formation of Photocatalyst Layer:

The above powder-form photocatalyst was dispersed in deionized water to obtain a slurry (solid content 20 wt %), which was milled with a wet mill (product name: dyno mill PILOT). The resultant solution was used as a photocatalytic dispersed solution.

In the subsequent step of forming photocatalyst layer, substrate 1 was dip-coated with the mixture of the photocatalytic dispersed solution and $TiO_2$ in the form of "TKC-301" (product of Tayca Corporation) at a weight ratio of 6:4, and was then heated for 1 hour at 350° C. to form photocatalyst layer 3 on the surface of substrate 1, which was to serve as printing plate 5. Photocatalyst layer 3 had a thickness of approximately 0.1 $\mu$m. As a result of measurement using "Contact Angle Meter, Model CA-W" (trade name; manufactured by KYOWA INTERFACE SCIENCE CO., LTD.), the surface of printing plate 5 formed a contact angle of 8° in relation to water thereon, which angle is enough to exhibit hydrophilicity.

Hydrophobization of the Surface:

Subsequently, 1,2-epoxydodecane (a product of Wako Pure Chemical Industries, Ltd.) was dissolved into an isoparaffine solution product name ISOPAR™-L manufactured by Exxon Mobile Corporation) so that a solution (1 wt %) was obtained. The surface of printing plate 5 was roll-coated with the 1,2-epoxydodecane solution and dried for 10 minutes at 60. The measured contact angle against water 6 was 83°, which exhibits adequate hydrophobicity, so that printing plate 5 was confirmed to be in the initial state in the making of the printing plate.

Formation of an Image:

Subsequently, halftone dot images of halftone-dot-area percentages ranging from 10% to 100% were written onto the surface of printing plate 5 at 10% intervals by an imaging system utilizing semiconductor laser beams having a wavelength of 405 nm, an output of 5 mW per channel and a beam diameter of 15 μm. The measurement of contact angles after the imaging using the contact angle meter confirmed that contact angles on portions written and not written by the semiconductor laser beams were respectively 8° and 83° so that the written and non-written portions were confirmed to be respectively a hydrophilic non-image area and a hydrophobic image area.

Performing of Printing:

Printing plate 5 was mounted on the New Ace Pro desk-top offset printing press (product of by ALPHA ENGINEERING INC.), and printing of the formed image performed on sheets of paper (ibest paper) using an ink "HYE-COO B Crimson MZ" (trade name; product of Toyo Ink Mfg. Co., Ltd.) and the fountain solution, 1% solution of "LITHOFELLOW" (trade mark; product of Mitsubishi Heavy Industries, Ltd.) at a printing speed of 3,500 sheets/hour. The halftone dot images were successfully printed on the first paper sheet.

Regeneration of Printing Plate:

Hereinafter, an embodiment in relation to regeneration of a printing plate will now be described.

After completion of printing, the entire surface of printing plate 5, from which ink, the fountain solution and paper dusts remaining have been removed, was irradiated with ultraviolet light having a wavelength of 254 nm and an illuminance of 10 mW/cm² emitted from a low-pressure Mercury lamp for 20 seconds. The contact angle of portions on which the halftone dot images have been formed was measured and the measured contact angle was 8° which is adequate to show hydrophilicity.

The surface of printing plate 5 was roll-coated with the 1,2-epoxydodecane solution and dried for 10 minutes at 60° C. again. The contact angle of water 6 on the surface of printing plate 5 measured with the contact angle meter was 84° which is enough to exhibit hydrophobicity. As a result, printing plate 5 was confirmed to be in the initial state in the making of the printing plate and regeneration of the printing plate was confirmed.

Comparative Examples

The following three comparative samples were prepared.

Comparative Sample #1

Substrate was dip-coated with an ammonium paratungstate solution, as a substitute for the above intermediate layer coating solution, was air dried, and was burned for 1 hour at 500° C. to form intermediate layer 2. Other processes were performed in the same manner as the above first embodiment to prepare printing plate 5. Intermediate layer 2 made of a tungsten trioxide had a thickness of approximately 0.1 μm.

Comparative Sample #2

Substrate was dip coated with the transparent conductive material SERAMACE S-8 solution (8 wt %, ultrafine powder of a tin dioxide, product of TAKI CHEMICAL CO., LTD.), as a substitute for the above intermediate layer coating solution, air-dried, burned for 1 hour at 500° C. so that intermediate layer 2 was formed. Other processes for making printing plate 5 were performed in the same manner as the above embodiment. Intermediate layer 2 of the comparative sample made of a tin dioxide had a thickness of approximately 0.09 μm.

Comparative Sample #3

Intermediate layer 2 was not formed whereupon photocatalyst layer 3 was formed directly on SUS substrate to make printing plate 5.

Evaluation:

The photocatalytic activity of printing plate 5 having intermediate layer 2 made of tungsten trioxide and tin dioxide in response to light having a wavelength of 405 nm were compared with that of each of the three comparative examples. The photocatalytic activity responsive to light was evaluated on the basis of capability to hydrophilze the surface to have a contact angle of water 6 on photocatalyst layer 3 of 10° or smaller, which hydrophilzing occurs concurrently with decomposing of an organic compound.

After each sample was roll coated with the 1,2-epoxydodecane solution, and dried in air for 10 minutes at 60° C. likewise the first embodiment so that the surface of printing plate 5 was hydrophobized to have a contact angle between 81° and 85°, printing plate 5 was irradiated with light having a wavelength of 405 nm, and irradiation energy required until the contact angle of the surface of printing plate 5 became 10° or smaller was measured. The irradiation energy was required to write a hydrophilic non-image area.

Figure 8:
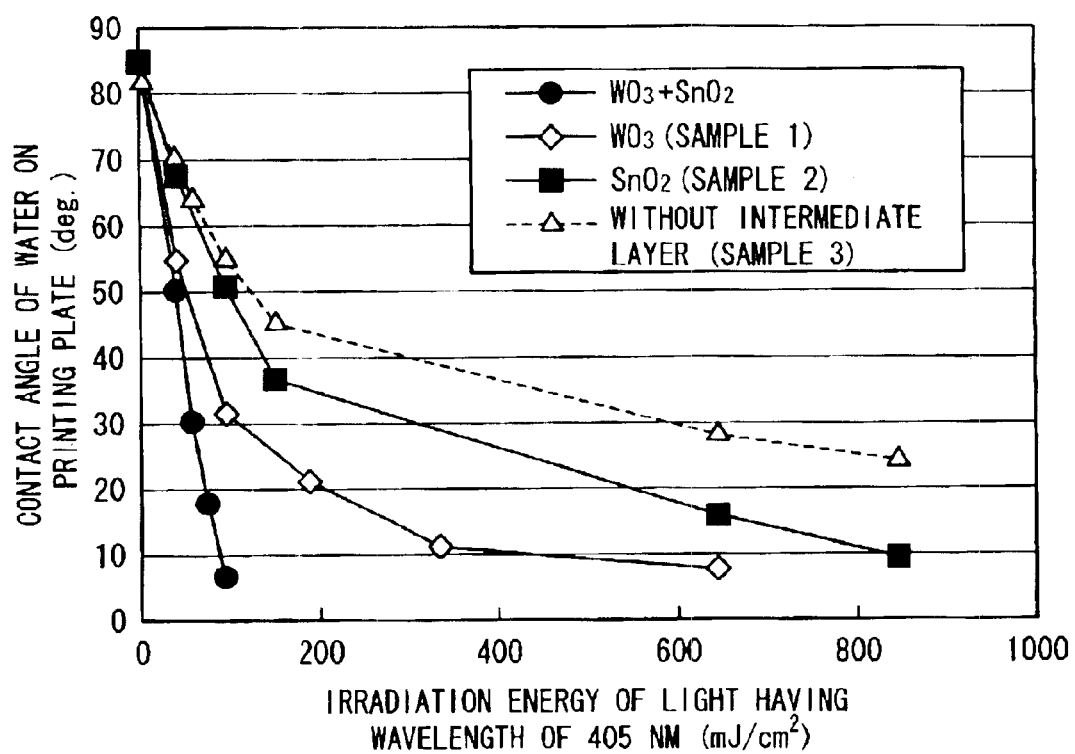
FIGS. 8 and 9 are graphs respectively showing a relationship between an amount of irradiation energy and a contact angle of water on the layered formation according to the first embodiment.

As shown in FIG. 8, when printing plate 5 having intermediate layer 2 made of tungsten trioxide and tin dioxide was irradiated with light having a wavelength of 405 nm at an approximate irradiation energy of 90 mJ/cm², printing plate 5 was hydrophilized to have a contact angle of 10° or smaller so that completion of writing of a non-image area was confirmed.

On the other hand, irradiation energy for printing plate 5 (comparative sample #1) having intermediate layer 2 made of tungsten trioxide and that for printing plate 5 (comparative sample #2) having intermediate layer 2 made of tin dioxide are respectively approximately 650 mJ/cm² and approximately 850 mJ/cm², which are smaller than that required by comparative sample #3. But, as compared with printing plate 5 having intermediate layer 2 made of tungsten trioxide and tin dioxide of the first embodiment, printing plates of comparative samples #1 and #2 require several times the irradiation energy required by that of the first embodiment.

As a result, printing plate 5 having intermediate layer 2 made of tungsten trioxide and tin dioxide was confirmed to have several times higher photocatalytic activity than that required by printing plate 5 having intermediate layer 2 made of either one from tungsten trioxide and tin dioxide.

Subsequently, a relationship between a contact angle of water 6 on the surface of printing plate 5 and irradiation energy is examined using printing plates having intermediate layers 2 in which tungsten trioxide and tin dioxide are mixed in respective different ratios.

Figure 9:
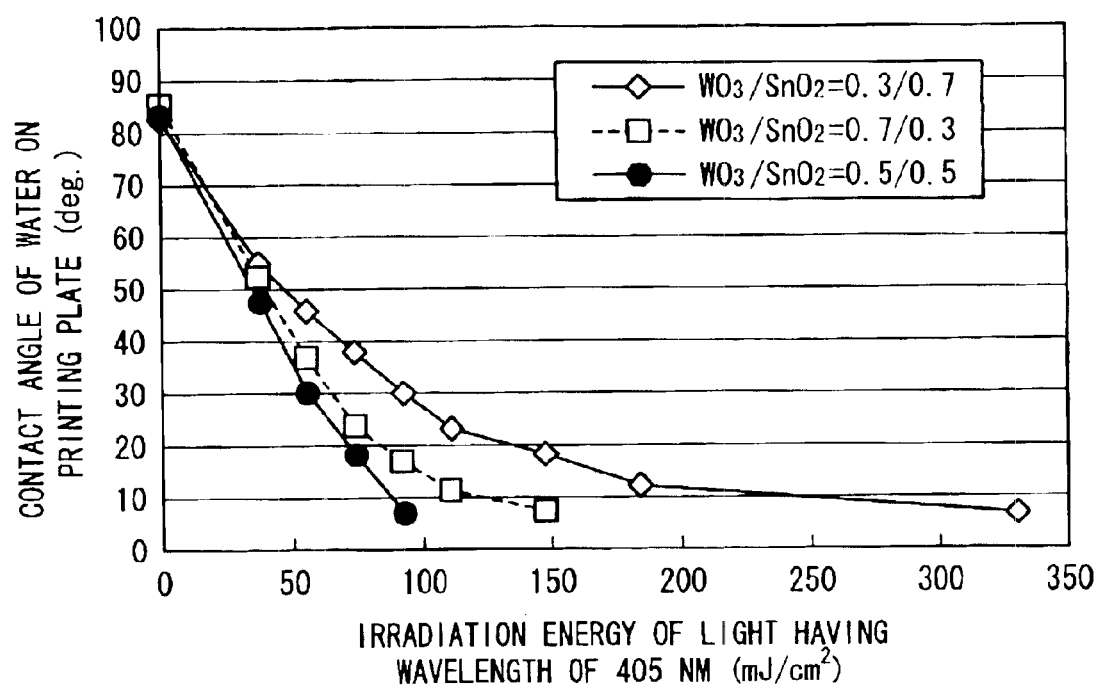

As shown in FIG. 9, irradiation energy required to hydrophilize the surface of printing plate 5 to have a contact angle up to 10° is approximately 330 mJ/cm² if a weight ratio of tungsten trioxide and tin dioxide mixed in intermediate layer 2 is 0.3:0.7 in the form of $WO_3$ and $SnO_2$, respectively; irradiation energy required by printing plate 5 having intermediate layer 2 in which tungsten trioxide and tin dioxide mixed in a weight ratio of 0.5:0.5 ($WO_3$:$SnO_2$) is approximately 90 mJ/cm$^2$; irradiation energy required by printing plate 5 having intermediate layer 2 in which tungsten trioxide and tin dioxide mixed at a weight ratio of WO$_3$:SnO$_2$ being 0.7:0.3 is approximately 150 mJ/cm$^2$. The required irradiation energy is therefore minimized when a weight ratio of a tungsten trioxide and a tin dioxide is 0.5:0.5 (1 to 1) among the three examples whereupon printing plate 5 in which the two oxides are mixed at another ratio likewise the other two examples require a larger amount of irradiation energy.

Namely, when intermediate layer 2 is formed by tungsten trioxide and tin dioxide in a weight ratio of 0.5:0.5, it is possible to lower the irradiation energy required to hydrophilize the surface of printing plate 5. In other words, when a constant amount of irradiation energy is used to hydrophilize the surface of printing plate 5, intermediate layer 2 in which tungsten trioxide and tin dioxide are mixed in a weight ratio of 0.5:0.5 takes the shortest time length whereupon it is possible to reduce the time required to make and regenerate a printing plate.

As mentioned above, since layered formation 5 of the first embodiment has intermediate layer 2 including two or more kinds of oxide semiconductors between substrate 1 and photocatalyst layer 3, it is possible to drastically improve photocatalytic activity, especially catalytic activity to oxidize and decompose an organic compound, so that the surface of photocatalyst layer 3 is rapidly hydrophilized.

With the above feature, when layered formation 5 is used as a printing plate, it is advantageously possible to reduce the time required to form an image using the activating light and to use a low-output imaging unit, in addition to the advantage that the printing plate can be reused, so that the cost for an apparatus can be also reduced.

Deletion of a formed image by irradiation with the activating light can reduce time required for the deletion. Further, it is possible to use a low-output image deleting unit likewise the above imaging unit, thereby reducing the cost for an apparatus.

Photocatalyst layer 3 of the first embodiment shows a high photocatalytic activity whereupon, when the surface of photocatalyst layer 3 is switched from hydrophobic to hydrophilic, it is possible to make a printing plate and delete a formed image after performing printing in shorter time lengths. Advantageously, making and regeneration of a printing plate can be rapidly performed.

Additionally, the activating light can be light having a wavelength of 600 nm or shorter, including visible light. Forming and deleting of an image is carried out using visible light so that the printing plate is easily handled and an image is formed also with ease.

Realization of regeneration and reuse of a printing plate greatly reduces wastes discarded after completion of printing an image. Since an image area is not formed by polymer, the washing solvent is not necessary to wash off the polymer for regeneration of the printing plate. The first embodiment has not only ecological advantages but also economical advantages because printing plate costs can be greatly reduced.

Making and regeneration of printing plate 5 can be performed while printing plate 5 is mounted on printing press 10 whereupon printing process performance is improved because an extra operation to exchange printing plate 5 can be omitted. Further, digital data representing a desired image can be directly formed onto printing plate 5. This digitalized printing can largely reduce time and cost required for all of the printing processes.

(B) Second Embodiment

A second embodiment of the present invention will now be described. Layered formation 5 of the second embodiment has a different intermediate layer from that of the first embodiment, so the description of this embodiment is made focusing on the intermediate layer.

Intermediate layer 2 of the second embodiment is in the form of a solid acid layer including a solid acid, and is hereinafter also called a "solid acid layer."

Solid acid layer 2 is formed on substrate 1, and solid acid layer 2 is preferably in contact with photocatalyst layer 3. If solid acid layer 2 is formed on photocatalyst layer 3 or photocatalyst layer 3 includes a solid acid, printing plate 5 has a lower photocatalytic activity, especially a lower capability in decomposing an organic compound, than printing plate 5 of the second embodiment in which solid acid layer 2 is formed between substrate 1 and photocatalyst layer 3 because of a lower ratio of photocatalyst exposure. Printing plate 5 which has solid acid layer 2 formed on photocatalyst layer 3 or which has photocatalyst layer 3 including a solid acid is therefore not practically used as a printing plate.

When conducting heat treatment for the formation of photocatalyst layer 3 to be described subsequently, solid acid layer 2 is also effective for preventing impurities included in the substrate 1 from thermodiffusing and from thereby mixing into photocatalyst layer 3, so that a reduction in photocatalytic activity is avoided. Further, if substrate 1 is formed by a polymer film, solid acid layer 2 protects substrate 1.

The Inventors estimate the reason that a photocatalytic activity is improved by forming solid acid layer 2 between substrate 1 and photocatalyst layer 3 in contact with photocatalyst layer 3 as follows.

When the photocatalyst is irradiated with the activating light, the photocatalyst generates electrons and positive holes, which holes are estimated to react with water molecules adhered to the surface of photocatalyst layer 3 and then generate OH radicals (hydroxy radicals). The generated OH radicals are thought to decompose an organic compound.

A recent research reveals an estimation that positive holes are related to hydrophilization of the photocatalyst caused by irradiation with the activating light. When recombination of the electrons and the positive holes generated by irradiation with the activating light is inhibited, the efficiency in usage of the positive holes are improved so that photocatalytic activity to decompose the organic compound and to hydrophilize the photocatalyst is improved.

Namely, if the solid acid is a Lewis acid, the solid acid can receive electrons inducted (excited) by light; and if the solid acid is a Brønsted acid, protons H$^+$ emitted from the solid acid can receive electrons inducted by light. It is therefore possible to inhibit recombination of the electrons and the positive holes generated by irradiation with the activating light and to improve the photocatalytic activity by forming solid acid layer 2 in contact with photocatalyst layer 3.

A preferable solid acid included in solid acid layer 2 is a metal oxide compound, which is exemplified by SiO$_2$/TiO$_2$, SiO$_2$/ZrO$_2$, TiO$_2$/ZrO$_2$, TiO$_2$/WO$_3$, WO$_3$/SnO$_2$, WO$_3$/SiO$_2$, WO$_3$/ZrO$_2$, WO$_3$/Fe$_2$O$_3$, and SiO$_2$/Al$_2$O$_3$.

Each of these solid acids has a Hammett acidity function H$_0$ below "−7" (i.e., H$_0$<−7), which function is used to indicate acidity (the smaller the function is, the larger the acidity is). An above example of SiO$_2$/TiO$_2$ represents a mixture of SiO$_2$ and TiO$_2$, i.e., a compound of SiO$_2$ and TiO$_2$.

Each of SiO$_2$/TiO$_2$, SiO$_2$/ZrO$_2$, TiO$_2$/ZrO$_2$ has a Hammett acidity function in a range of −11.93<H$_0$<−7 so that the mixtures are solid acids lower in acidity than 100% sulfuric acid having a Hammett acidity function $H_0$ of −11.93.

Hammett acidity functions $H_0$ of $TiO_2/WO_3$ and $WO_3/SnO_2$ are respectively between −13 and −14 inclusive (i.e., $-14 \leq H_0 \leq -13$); $H_0$ of $WO_3/SiO_2$ is −14; $H_0$ of $WO_3/ZrO_2$, between −13 and −15 inclusive (i.e., $-15 \leq H_0 \leq -13$); $H_0$ of $WO_3/Fe_2O_3$, and $SiO_2/Al_2O_3$, between −12 and −13 inclusive (i.e., $-13 \leq H_0 \leq -12$). The mixtures of $TiO_2/WO_3$, $WO_3/SnO_2$, $WO_3/SiO_2$, $WO_3/ZrO_2$, $WO_3/SiO_2$, $WO_3/Fe_2O_3$, and $SiO_2/Al_2O_3$ are super strong acids larger in acidity than the above mixtures of $SiO_2/TiO_2$, $SiO_2/ZrO_2$, $TiO_2/ZrO_2$.

Since printing plate 5 having solid acid layer 2 in contact with photocatalyst layer 3 so that enhanced photocatalytic activity reduces irradiation energy (hereinafter, called "hydrophilization energy") of the activating light required to hydrophilize the surface of printing plate 5 in a hydrophobic state, it is possible for layered formation 5 used as a printing plate to shorten the time to make a printing plate by speeding up imaging and to reduce the cost to make a printing plate by lowering an output of the imaging unit. At the same time, it is also possible to reduce irradiation energy of the activating light required to delete an image formed on printing plate 5 whereupon time for the deletion and an output of the image deleting unit (i.e., cost for manufacturing a printing press) can be reduced.

The Inventors have confirmed the following results of the second embodiment and its comparative example in relation to making and regeneration of a printing plate when a layered formation 5 is used as a printing plate.

(B-1) Result of Second embodiment:
Preparation of Photocatalyst:

The stirred Ammonia solution was added to a starting material of a titanium sulfate (a product of Wako Pure Chemical Industries, Ltd.) to obtain a titanium sulfate hydrolysate, which was filtered through a Buchner funnel. The residue titanium sulfate hydrolysate was washed with deionized water until electrical conductivity of the filtrate came to be 2 $\mu$S/cm or smaller. After washing, the hydrolysate was dried at room temperature and then burned in the atmosphere for two hours at 400° C. The burnt product was roughly milled with a mortar, so that a powder-form photocatalyst was obtained.

Confirmation of Visible-light Activity:

The above powder-form photocatalyst (0.2 g) was evenly spread over the bottom of a sealable cylindrical reaction container (500 ml) made of PYREX® glass. The atmosphere in the reaction container was deaerated and substituted with highly-purified air. Acetone (500 ppm) was added into the reaction container and was absorbed into the photocatalyst in a dark place for 10 hours at 25 until the contents in the reaction container reached absorption equilibrium. After that, the contents were irradiated with light (having the major wavelength of 470 nm) emitted from blue LED (produced by Nichia Corporation). As a result of a follow-up measurement on amounts of acetone and carbon dioxide ($CO_2$) using a gas chromatograph manufactured by Shimadzu Corporation, the Inventors confirmed that irradiation with light emitted from the blue LED for 20 hours decomposed all acetone in the reacting container and generated carbon dioxide $CO_2$ whose amount corresponds to the stoichiometry proportion of the acetone. Namely, the Inventors have confirmed that the photocatalyst was activated by light having a wavelength of 470 nm.

Making of a Printing Plate:

(1) Making of a Photocatalytic Dispersed Solution and a Printing Plate:

The above powder-form photocatalyst was dispersed in deionized water to obtain slurry (solid content 20 weight % (wt %)), to which a polycarboxylic dispersed solution (1 wt %) was added. The slurry was milled with a wet mill (product name: dyno mill PILOT). The resultant solution was used as a photocatalytic dispersed solution.

Alkaline degreasing was performed on a stainless-steel (SUS301) board whose area was 280×204 mm and thickness was 0.1 mm to prepare substrate 1.

(2) Formation of Solid Acid Layer 2:

Water glass LSS-35 (product of Nissan Chemical Industries, LTD.) including lithium oxide ($Li_2O$) was diluted with distilled water until solid $SiO_2$ concentration became 5 wt %, to prepare a $SiO_2$ solution. A titanium dioxide coating formulation TKC-301 product of Tayca Corporation was added to the $SiO_2$ solution at a ratio of $SiO_2/TiO_2$=50/50 and was mixed to be a uniform solution. The resultant solution was used as a $SiO_2/TiO_2$ coating solution.

After that, substrate 1 was dip-coated with the $SiO_2/Tio_2$ coating solution and then heated for 1 hour at 500° C. to form a solid acid $SiO_2/TiO_2$ layer having a thickness of approximately 0.10 $\mu$m.

(3) Formation of Photocatalyst Layer 3:

Substrate 1, on which solid acid layer 2 has been formed by dip-coating with the $SiO_2/Tio_2$ coating solution, was further dip-coated with the mixture of the photocatalytic dispersed solution and $TiO_2$ in the form of "TKC-301" (product of Tayca Corporation) at a weight ratio of 6:4, and was then heated for 1 hour at 350° C. to form photocatalyst layer 3. The resultant layered formation served as printing plate 5. Photocatalyst layer 3 had a thickness of approximately 0.12 $\mu$m. As a result of measurement using Contact Angle Meter, Model CA-W (trade name; manufactured by KYOWA INTERFACE SCIENCE CO., LTD.), the surface of printing plate 5 formed a contact angle of 7° against water 6 thereon, which angle is enough to exhibit hydrophilicity.

Hydrophobizing of the Surface:

Subsequently, 1,2-epoxyhexadecane (a product of Wako Pure Chemical Industries, Ltd.) was dissolved into an isoparaffine solution (product name ISOPAR™-L manufactured by Exxon Mobile Corporation) so that a 1,2-epoxyhexadecane solution (1 wt %) was obtained. The surface of printing plate 5 was roll-coated with the 1,2-epoxydodecane solution and dried for 10 minutes at 60. After that, a contact angle against water using the contact angle meter was measured. The measured contact angle was 87° which exhibits adequate hydrophobicity so printing plate 5 was confirmed to be in the initial state in the making of the printing plate.

Measurement of Hydroplilization Energy:

The hydrophobized printing plate 5 (formed by $TiO_2$ photocatalyst layer 3/($SiO_2/TiO_2$) solid acid layer 2/stainless steel substrate 1) is irradiated with activating light having a wavelength of 360 nm and an illuminance of 10 mw/cm² to obtain hydrophilization energy until the hydrophobic surface changes into a hydrophilic state in which the contact angle of water thereon becomes 10° or smaller using a product of time of the irradiation with the activating light and the illuminance of the activating light. The hydrophilization energy at the surface temperature 25° C. was 0.33 $J/cm^2$, as shown by a solid line in FIG. 10.

Formation of image:

Subsequently, halftone dot images of halftone-dot-area percentages ranging from 10% to 100% were formed onto the surface of printing plate 5 at 10% intervals with UV-SETTER™ 710 (manufactured by basysPrint GmbH) which is able to form an image (write a non-image area) by exposing ultraviolet light having a wavelength of 360 to 450 nm. Since the illuminance of light having a wavelength of 360 nm emitted from the UV-SETTER™ 710 is 200 mW/cm², irradiation time and irradiation energy for one area were set to 1.8 seconds and 0.36 J/cm², respectively.

One area is 17 mm by 13 mm and forming of an image (having an image area of 272 mm by 195 mm) on printing plate 5 that is 280 mm by 204 mm takes 7 minutes 12 seconds. The measurement of contact angles of water 6 thereon using the contact angle meter confirmed that contact angles on portions written and not written were respectively 6° and 87° so that the written and non-written portions were respectively a hydrophilic non-image area and a hydrophobic image area.

Performing of Printing:

Printing plate 5 was mounted on a New Ace Pro desk-top offset printing press, and printing of the formed image was performed on sheets of paper (ibest paper) using an ink "HYECOO B Crimson MZ" (trade name; product of Toyo Ink Mfg. Co., Ltd.) and the fountain solution, a 1% solution of LITHOFELLOW (trade mark; product of Mitsubishi Heavy Industries, Ltd.) at a printing speed of 3,500 sheets/hour. The halftone dot images were successfully printed on the first paper sheet.

Regeneration of a Printing Plate:

Hereinafter, an embodiment for regeneration of a printing plate will now be described.

After completion of printing, the entire surface of printing plate 5, from which ink, the fountain solution and remaining paper dusts have been removed, was irradiated with ultraviolet light having a wavelength of 360 nm and an illuminance of 10 mW/cm² emitted from a low-pressure Mercury lamp for 35 seconds (the irradiation energy is 0.35 J/cm²). The contact angle of portions on which the halftone dot images have been formed was measured and the measured contact angle was 6° which is adequate to show hydrophilicity whereupon an image formed on the printing plate 5 is confirmed to be deleted.

The surface of printing plate 5 was roll coated with the 1,2-epoxyhexadecane solution and dried for 10 minutes at 60° C. again. The measured contact angle with the contact angle meter was 88°, enough to exhibit hydrophobicity. As a result, printing plate 5 was confirmed to be in the initial state in the making of the printing plate so that printing plate regeneration succeeded.

(B-2) Result of Comparative Example:

A printing plate was made by forming photocatalyst layer 3 directly on stainless-steel substrate 1 and the remaining making processes were performed in the same manner as those of the second embodiment. Namely, the printing plate of the comparative example does not have solid acid layer 2.

Figure 10:
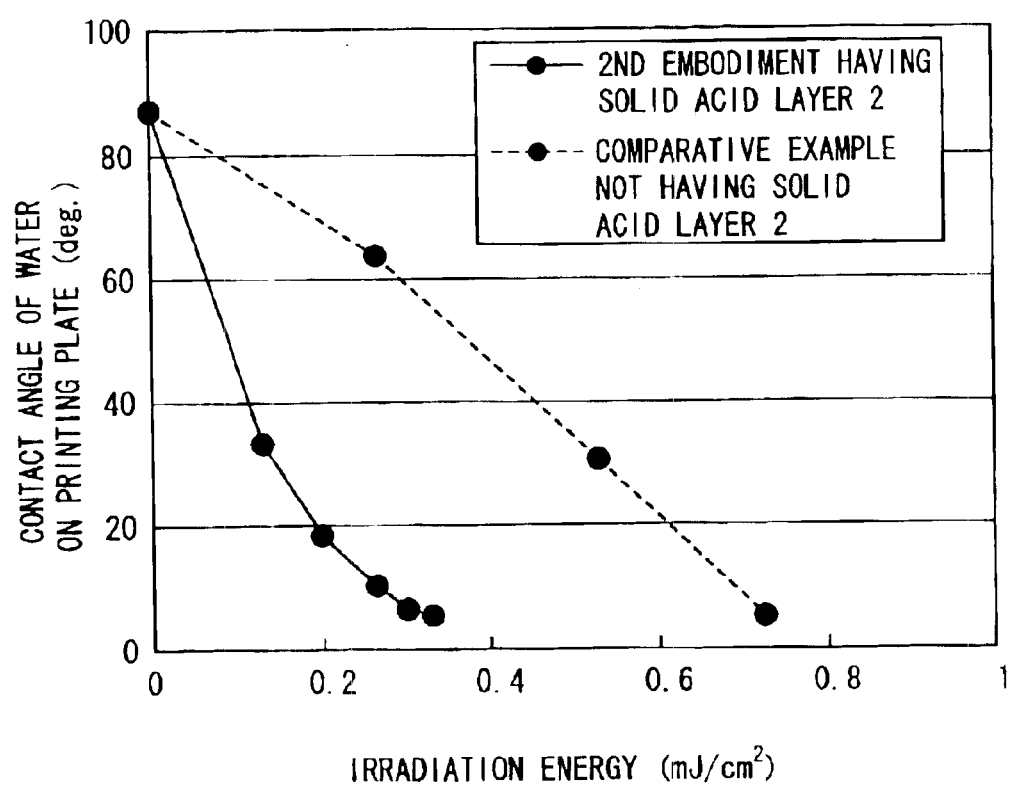
FIG. 10 is a graph showing a relationship between an amount of irradiation energy and a contact angle of water on layered formations of a second embodiment and a comparative example.

Hydrophilization energy for the printing plate of the comparative example is measured in the same manner as the second embodiment and the result is shown in FIG. 10.

As the dotted line of FIG. 10 shows, the printing plate without solid acid layer 2 (i.e., formed by TiO₂ photocatalyst layer 3/stainless steel substrate 1) requires hydrophilization energy of 0.72 J/cm² at 25 to make the contact angle of water on the surface 10° or smaller.

In the same manner as that of the second embodiment, an image was formed on the surface of the printing plate of the comparative example with the exposure time per area of 1.8 seconds using the UV-SETTER™ 710. The contact angle meter measured that written portion to be a non-image area has a contact angle of water 6 of 43°, which is not adequate to show hydrophilicity. Further, the printing plate was mounted on a New Ace Pro desk-top offset printing press, and printing of the formed image is performed on sheets of paper (ibest paper) using ink "HYECOO B Crimson MZ" (trade name; product of Toyo Ink Mfg. Co., Ltd.) and the fountain solution, 1% solution of LITHOFELLOW (trade mark; product of Mitsubishi Heavy Industries, Ltd.) at a printing speed of 3,500 sheets/hour, as with the second embodiment. Ink adhered on a portion corresponding to the non-image area (were the ink would not adhere) on printing sheets whereupon the image formed on the printing plate of the comparative example does not succeed in printing on paper sheets.

It is preferable to use printing press 10 as shown in FIG. 7 in order to make and regenerate printing plate 5 of the second embodiment while being mounted on a printing plate.

As described above, since the layered formation 5 of the second embodiment includes a solid acid layer (intermediate layer) 2 between substrate 1 and photocatalyst layer 3, it is possible to greatly enhance the photocatalytic activity, especially the catalytic activity to oxidize an organic compound, so that the surface of photocatalyst layer 3 can be rapidly hydrophilized.

As a result, the printing plate of the second embodiment has identical advantages to those of the first embodiment.

Further, the present invention should by no means be limited to these foregoing embodiments, and various changes or modifications may be suggested without departing from the gist of the invention.

What is claimed is:

1. A layered formation having properties of decomposing an organic compound on the surface of said layered formation and concurrently hydrophilizing the surface of said layered formation in response to irradiation of the surface of said layered formation with activating light having energy higher than a band-gap energy of a photocatalyst, said layered formation comprising:
   a substrate;
   a photocatalyst layer including the photocatalyst; and
   an intermediate layer including two or more kinds of oxide semiconductors and being formed between said substrate and said photocatalyst layer.

2. A layered formation according to claim 1, wherein said photocatalyst included in said photocatalyst layer is a selected one from a titanium dioxide photocatalyst and a visible-light-responsive titanium dioxide photocatalyst.

3. A layered formation having properties of decomposing an organic compound on the surface of said layered formation and concurrently hydrophilizing the surface of said layered formation in response to irradiation of the surface of said layered formation with activating light having energy higher than a band-gap energy of a photocatalyst, said layered formation comprising:
   a substrate;
   a photocatalyst layer including the photocatalyst; and
   an intermediate layer including a solid acid and being formed between said substrate and said photocatalyst layer.

4. A layered formation according to claim 3, wherein said solid acid included in said intermediate layer is a metal oxide complex.

5. A layered formation according to claim 4, wherein said metal oxide complex is a selected one from $SiO_2/TiO_2$, $SiO_2/ZrO_2$, $TiO_2/ZrO_2$, $TiO_2/WO_3$, $WO_3/Fe_2O_3$, $WO_3/ZrO_2$, $WO_3/SnO_2$, $WO_3/SiO_2$, and $SiO_2/Al_2O_3$.

6. A layered formation according to claim 5, wherein the tungsten trioxide ($WO_3$) and the tin dioxide ($SnO_2$) are mixed in a weight ratio of 1:1.

7. A layered formation according to claim 3, wherein said photocatalyst included in said photocatalyst layer is a selected one from a titanium dioxide photocatalyst and a visible-light-responsive titanium dioxide photocatalyst.

8. A method for making a layered formation having properties of decomposing an organic compound on the surface of said layered formation and concurrently hydrophilizing the surface of said layered formation in response to irradiation of the surface of said layered formation with activating light having energy higher than a band-gap energy of a photocatalyst, said layered formation comprising a substrate, a photocatalyst layer including the photocatalyst and an intermediate layer including two or more kinds of oxide semiconductors and being formed between said substrate and said photocatalyst layer, comprising the step of:

after forming of said intermediate layer on said substrate, forming said photocatalyst layer on said intermediate layer.

9. A method for making a layered formation having properties of decomposing an organic compound on the surface of said layered formation and concurrently hydrophilizing the surface of said layered formation in response to irradiation of the surface of said layered formation with activating light having energy higher than a band-gap energy of a photocatalyst, said layered formation comprising a substrate, a photocatalyst layer including the photocatalyst and an intermediate layer including a solid acid and being formed between said substrate and said photocatalyst layer, comprising the step of:

after forming of said intermediate layer on said substrate, forming said photocatalyst layer on said intermediate layer.

10. A printing plate on which an image is formed and deleted by irradiating with activating light having energy higher than a band-gap energy of a photocatalyst so that the image is formed on said printing plate without performing a wet development process and said printing plate is repetitiously reused, said printing plate comprising:

a substrate;

a photocatalyst layer including the photocatalyst; and an intermediate layer including two or more kinds of oxide semiconductors and being formed between said substrate and said photocatalyst layer.

11. A printing plate according to claim 10, wherein said photocatalyst layer has a surface property which is changed from hydrophobic to hydrophilic upon application of the activating light to the surface of said photocatalyst layer.

12. A printing plate according to claim 10, wherein the photocatalyst turns hydrophilic upon application thereto of the activating light at a wavelength of 600 nm or shorter.

13. A printing plate according to claim 10, wherein said photocatalyst layer has a surface property which turns hydrophobic in response to any of the following procedures: irradiating the surface of said photocatalyst layer with energy fluxes of one from light, electricity, and a combination of light and electricity; creating friction on the surface of said photocatalyst layer; applying an organic compound able to interact with the surface of said photocatalyst layer onto the surface of said photocatalyst layer.

14. A printing plate according to claim 13, wherein the organic compound is at least one of an organic titanium compound, an organic silane compound, and an isocyanate compound, and an epoxide compound.

15. A printing plate on which an image is formed and deleted by irradiating with activating light having energy higher than a band-gap energy of a photocatalyst so that the image is formed on said printing plate without performing a wet development process and said printing plate is repetitiously reused, said printing plate comprising:

a substrate;

a photocatalyst layer including the photocatalyst; and an intermediate layer including a solid acid and being formed between said substrate and said photocatalyst layer.

16. A printing plate according to claim 15, wherein said photocatalyst layer has a surface property which is changed from hydrophobic to hydrophilic upon application of the activating light to the surface of said photocatalyst layer.

17. A printing plate according to claim 15, wherein the photocatalyst turns hydrophilic upon application thereto of the activating light at a wavelength of 600 nm or shorter.

18. A printing plate according to claim 15, wherein said photocatalyst layer has a surface property which turns hydrophobic in response to any of the following procedures: irradiating the surface of said photocatalyst layer with energy fluxes of one from light, electricity, and a combination of light and electricity; creating friction on the surface of said photocatalyst layer; applying an organic compound able to interact with the surface of said photocatalyst layer onto the surface of said photocatalyst layer.

19. A printing plate according to claim 18, wherein the organic compound is at least of an organic titanium compound, an organic silane compound, and an isocyanate compound, and an epoxide compound.

20. A method for making a printing plate which includes a photocatalyst layer including a photocatalyst and on which an image is formed and deleted by irradiating with activating light having energy higher than a band-gap energy of the photocatalyst so that the image is formed on said printing plate without performing a wet development process and said printing plate is repetitiously reused, said method comprising the steps of:

(a) forming an intermediate layer including two or more kinds of oxide semiconductors on the surface of a substrate; and (b) forming the photocatalyst layer including the photocatalyst on the surface of the intermediate layer.

21. A method for making a printing plate according to claim 20, wherein:

said step (a) of forming the intermediate layer is performed by applying a sol solution including the two or more kinds of oxide semiconductors on the substrate and then hardening the sol solution; and said step (b) of forming the photocatalyst layer is performed by applying a sol solution including the photocatalyst on the intermediate layer and then hardening the last-named sol solution.

22. A method for making a printing plate according to claim 20, wherein:

said step (a) of forming the intermediate layer is performed by sputtering using the two or more kinds of oxide semiconductors; and said step (b) of forming the photocatalyst layer is performed by sputtering using the photocatalyst in order to form a layer including the photocatalyst and then baking the last-named layer.

23. A method for making a printing plate according to claim 20, wherein the two or more kinds of oxide semiconductors in the intermediate layer include tungsten trioxide ($WO_3$) and tin dioxide ($SnO_2$).

24. A method for making a printing plate which includes a photocatalyst layer including a photocatalyst and on which an image is formed and deleted by irradiating with activating light having energy higher than a band-gap energy of the photocatalyst so that the image is formed on said printing plate without performing a wet development process and said printing plate is repetitiously reused, said method comprising the steps of:

(a) forming an intermediate layer including a solid acid on the surface of a substrate; and (b) forming the photocatalyst layer including the photocatalyst on the surface of the intermediate layer.

25. A printing press comprising:

a plate cylinder around which a printing plate on which an image is formed and deleted by irradiating with activating light having energy higher than a band-gap energy of a photocatalyst so that the image is formed on said printing plate without performing a wet development process and said printing plate is repetitiously reused is mounted, said printing plate having: a substrate; a photocatalyst layer including the photocatalyst: and an intermediate layer including two or more kinds of oxide semiconductors and being formed between said substrate and said photocatalyst layer;

a hydrophobizing unit for hydrophobizing the surface of the photocatalyst layer;

an imaging unit for forming an image on the surface of the photocatalyst layer in a hydrophobic state by irradiating with activating light having a wavelength of 600 nm or shorter;

a plate cleaning unit for removing remaining ink applied to the surface of the photocatalyst layer after printing of the image formed by said imaging unit is completed; and an image deleting unit for hydrophilizing the surface of the photocatalyst layer by irradiating the surface of the photocatalyst layer with the activating light so that the image formed by said imaging unit is deleted after said plate cleaning unit removes the remaining ink.

26. A printing press comprising:

a plate cylinder around which a printing plate on which an image is formed and deleted by irradiating with activating light having energy higher than a band-gap energy of a photocatalyst so that the image is formed on said printing plate without performing a wet development process and said printing plate is repetitiously reused is mounted, said printing plate having; a substrate; a photocatalyst layer including the photocatalyst; and an intermediate layer including a solid acid and being formed between said substrate and said photocatalyst layer;

a hydrophobizing unit for hydrophobizing the surface of the photocatalyst layer;

an imaging unit for forming an image on the surface of the photocatalyst layer in a hydrophobic state by irradiating with activating light having a wavelength of 600 nm or shorter;

a plate cleaning unit for removing remaining ink applied to the surface of the photocatalyst layer after printing of the image formed by said imaging unit is completed; and an image deleting unit for hydrophilizing the surface of the photocatalyst layer by irradiating the surface of the photocatalyst layer with the activating light so that the image formed by said imaging unit is deleted after said plate cleaning unit removes the remaining ink.

* * * * *